United States Patent [19]
Chang et al.

[11] Patent Number: 5,516,725
[45] Date of Patent: May 14, 1996

[54] PROCESS FOR PREPARING SCHOTTKY DIODE CONTACTS WITH PREDETERMINED BARRIER HEIGHTS

[75] Inventors: Y. Austin Chang, Middleton, Wis.; Chia-Hong Jan, Portland, Oreg.; Chia-Ping Chen, Madison, Wis.

[73] Assignee: Wisconsin Alumni Research Foundation, Madison, Wis.

[21] Appl. No.: 85,622

[22] Filed: Jun. 30, 1993

Related U.S. Application Data

[63] Continuation-in-part of Ser. No. 851,729, Mar. 17, 1992, abandoned.
[51] Int. Cl.⁶ .................................................. H01L 21/44
[52] U.S. Cl. ........................ 437/177; 437/184; 437/179; 437/912
[58] Field of Search ..................................... 437/176, 179

[56] References Cited

U.S. PATENT DOCUMENTS

| | | |
|---|---|---|
| 3,839,181 | 10/1974 | Degueldre et al. . |
| 4,019,925 | 4/1974 | Nenno et al. . |
| 4,526,624 | 7/1985 | Tombrello et al. . |
| 4,695,869 | 9/1987 | Inoue et al. . |
| 4,771,017 | 9/1988 | Tobin et al. . |
| 4,796,082 | 1/1989 | Murakami et al. . |
| 4,847,675 | 7/1989 | Eng . |
| 5,016,074 | 5/1991 | Sands . |
| 5,019,891 | 5/1991 | Onuki et al. . |

FOREIGN PATENT DOCUMENTS

WO89/04057  5/1989  WIPO .

OTHER PUBLICATIONS

D. A. Hodges and H. S. Jackson, *Analysis and Design of Digital Integrated Circuits*, 2nd Ed., pp. 144–147 and 415–421, McGraw–Hill Book Co., New York (1988).
R. V. Normantas, G. A. Zubauskas, and L. B. Guoba, *Interface Interaction in Multilayer Ni–Al–GaAs and Al–Ni––GaAs Structures*, 30 (5), 614–617 (1990) and republished in English by Allerton Press in 30 (5), 74–76 (1990).
Sands et al., *Appl. Phys. Lett.*, 52 (3), 197–199 (1988).
Sands et al., *Appl. Phys. Lett.*, 52 (15), 1216–1218 (1988).
Sands et al., *Appl. Phys. Lett.*, 52 (16), 1338–1340 (1988).
Sands et al., *Mater. Sci. Reports*, 5, 99–170 (1990).
Guivarc'h et al., *Electronic Letters*, 23 (19), 1004–1005 (1987).
Guivarc'h et al., *J. of Crystal Growth*, 95, 427–430 (1989).
Chang, *Mat. Res. Soc. Symp. Proc.*, 260, 43–52 (1992).
Abstract of paper by Chen et al. published in late Sep. 1992 entitled: "*A Tunable Schottky Barrier to N–GaAs Using Ni(Ga,Al) Contacts.*"
Chen et al., "*A Tunable Schottky Barrier to n–GaAs Using Ni(Ga,Al) Contacts,*" Mat. Res. Soc. Symp. Proc., 281, 683–688 (1993).

(List continued on next page.)

*Primary Examiner*—Brian E. Hearn
*Assistant Examiner*—Lynne A. Gurley
*Attorney, Agent, or Firm*—Foley & Lardner

[57] ABSTRACT

A process is provided for producing a Schottky diode having a preselected barrier height $\phi_{Bn}$. The substrate is preferably n-GaAs, the metallic contact is derived from a starting alloy of the Formula $[\Sigma M_\delta](Al_x Ga_{1-x})$ wherein: $\Sigma M$ is a moiety which consists of at least one M, and when more than one M is present, each M is different, M is a Group VIII metal selected from the group consisting of nickel, cobalt, ruthenium, rhodium, indium and platinum, $\delta$ is a stoichiometric coefficient whose total value in any given $\Sigma M$ moiety is 1, and x is a positive number between 0 and 1 (that is, x ranges from greater than 0 to less than 1). Also, the starting alloy is capable of forming with the substrate a two phase equilibrium reciprocal system of the binary alloy mixture $[\Sigma M_\delta]$ Ga–$[\Sigma M_\delta]$Al–AlAs–GaAs. When members of an alloy subclass within this Formula are each preliminarily correlated with the barrier height $\phi_{Bn}$ of a contact producable therewith, then Schottky diodes of predetermined barrier heights are producable by sputtering and annealing. Further provided are the product Schottky diodes that are produced according to this process.

17 Claims, 6 Drawing Sheets

OTHER PUBLICATIONS

Jan *"Interfacial Phenomena in the Contact Metallization of GaAs with Ni–Based Intermetallic Alloys,"* Doctoral Thesis, University of Wisconsin, Madison (1991). (pub. date unknown).

Ghandi, VLSI Fabrication Principles, Silicon and Gallium Arsenide, John Wiley & Sons, Inc., 1983, pp. 463–470, 520–527, 598–603.

PROCESS FOR PREPARING SCHOTTKY DIODE CONTACTS WITH PREDETERMINED BARRIER HEIGHTS

This invention was made with United States Government support awarded by the Department of Energy (DOE) Grant No. DE-FG 02-86ER452754. The United States Government has certain rights in this invention.

RELATED APPLICATION

This application is a continuation-in-part of U.S. patent application Ser. No. 851,729 filed Mar. 17, 1992.

FIELD OF THE INVENTION

This invention relates to the production of Schottky diode contacts which have specific predetermined barrier heights on n-type gallium and/or aluminum arsenide substrates and to the semiconductor devices so produced.

BACKGROUND

A Schottky barrier diode (also known as a surface-barrier diode and as a metal-semiconductor diode) comprises a semiconductor substrate (such as silicon or gallium arsenide) which has a metal contact (such as gold, platinum, palladium or silver) formed on a localized area of one substrate face. The diode formation has been previously achieved by evaporation techniques or by ion implantation through the surface of the semiconductor. An electrostatic barrier characteristically exists at the metal-semiconductor interface which causes the interface to have rectifying properties.

In the case of an n-type semiconductor, for example, when a forward bias (that is, a positive voltage $V_F$) is applied across the interface, current flows freely and majority carriers are injected into the metal side of the interface (or junction) where they remain majority carriers at some energy greater than the Fermi energy of the metal. When a reverse voltage $V_R$ is applied across the same interface, the current flow is blocked. Switching from the $V_F$ "on" state to the $V_R$ "off" state can occur in an extremely short time (in the order of picoseconds). No stored minority-carrier charge exits. The reverse dc current-voltage characteristics of such a diode are very similar to those of conventional pn junction diodes.

For present definitional purposes, FIG. 1 includes an energy band diagram for a Schottky barrier junction 10 under a thermal equilibrium bias state. Electrons flow from the semiconductor 11 into the metal of the contact 12 until the energy of the electrons in the contact 12 and the semiconductor 11 are equal. Thus, the Fermi levels of the metal and semiconductor $E_F^m$ and $E_F^S$, respectively, are equal and the resulting level is shown in FIG. 1 as $E_F$. The electrons which flow out of the semiconductor 11 leave behind immobile, positively charged dopant ions within the (n-type) semiconductor 11 that create an electric field within the semiconductor 11. $E_C$ and $E_V$ are the conduction and the valence band edges, respectively, $E_g$ is the band gap, and 14 is the valence band in metal contact 12. The bending of the energy bands at the interface 13 between metal contact 12 and semiconductor 11 occurs in such a manner as to retard the flow of majority carriers into the metal contact 12. The work function of the metal contact 12 is indicated by $\phi_m$. The electron affinity $X_s$ of the semiconductor 11 is also indicated.

The Schottky energy barrier height $\phi_{Bn}$ that is present at the interface 13 is thus defined as the energy difference between the Fermi level in the metal contact 12 and the conduction band $E_c$ minimum in the semiconductor 11 at the interface 13. It has previously been found that $\phi_{Bn}$ is essentially independent of the semiconductor doping level.

Schottky described the relationship between the barrier height $\phi_{Bn}$, the work function $\phi_m$ of the contact metal 12 and the electron affinity $X_s$ of the semiconductor 11 by the relationship:

$$\phi_{Bn} = \phi_m - X_s \qquad (1)$$

which is the so-called "Schottky model". This model predicts that the Schottky barrier height $\phi_{Bn}$ is proportional to the work function $\phi_m$ of the contact metal 12 so that, by choosing different metals, contact behavior can be varied so as to range from ohmic to rectifying characteristics.

Unfortunately, this model does not hold for metal contacts on gallium arsenide (GaAs)-type substrates. For most metal/GaAs interfaces, $\phi_{Bn}$ is independent of the metal; that is, Fermi level pinning is observed. Also, most metals are not in thermodynamic equilibrium with GaAs. An elemental metal is not useful as a contact for a GaAs substrate if long-term stability is to be maintained.

For quantification purposes, three methods are known for measuring the barrier height $\phi_{Bn}$ of a metal-semiconductor contact: (1) the current voltage method (I–V), (2) the capacitance-voltage method (C–V), and (3) the internal photoemission methods. The respective values of $\phi_{Bn}$ obtained using each measuring method often do not agree with one another.

In the I–V method, the thermionic-emission mechanism is assumed. The relationship between the current density J and the applied forward voltage V is given by the equation:

$$J = A^{**}T^2 \exp[-q(\phi_{Bn} - \Delta\phi_{Bn})/\kappa T][\exp(qV/n\kappa T) - 1] \qquad (1.1)$$

in which $A^{**}$ is the effective Richardson constant (8.64 A/cm$^2$·K$^2$ for n-GaAs), $\kappa$ is the Boltzmann constant, T is the temperature, $\phi_{Bn}$ is the Schottky barrier lowering [$x = (qE/4\pi\epsilon_s)^{1/2}$], where E is the maximum electric field at the metal-semiconductor interface and $\epsilon_s$ is the permittivity of the semiconductor) and n is the ideality factor, which is an indication of the deviation of the contact from ideal thermionic-emission behavior. The ideality factor, n, has to be close to 1 to assure the applicability of the above equation.

If $V > 3\kappa T/q$, Eq. (1.1) can be simplified as follows:

$$\begin{aligned} J &= A^{**}T^2 \exp[-q(\phi_{Bn} - \Delta\phi_{Bn})/\kappa T]\exp(qV/n\kappa T) \\ &= J_s \exp(qV/n\kappa T) \end{aligned} \qquad (1.2)$$

In a plot of ln J vs. V, the slope yields the ideality factor n via the relation $$n = q/\kappa T^* [\partial V/\partial(\ln J)] \qquad (1.3)$$

and the intercept on the ln J axis yields the saturation current $J_s$ which may be used to determine $\phi_{Bn}$:

$$\phi_{Bn} = \kappa T/q[\ln(A^{**}T^2/J_s)] + \Delta\phi_{Bn} \qquad (1.4)$$

The $\phi_{Bn}$ and n values are not sensitive to errors in $A^{}$ because $A^{}$ is inside the logarithmic term.

In the C–V method, use is made of the fact that when a small alternating current (dc) voltage is superimposed upon a direct current (dc) bias, charges of one sign are induced on the metal surface and charges of the opposite sign are induced in the semiconductor. Based on the depletion theory, the relationship between the capacitance at the metal-semiconductor interface and the Schottky barrier height can be derived as:

$$1/C^2 = 2(\phi_{Bn} - V - \kappa T/q)/q\epsilon_s N_D \qquad (1.5)$$

where $N_D$ is dopant concentration in the semiconductor, s is the permittivity of the semiconductor, C is the depletion-layer capacitance and V is the applied reverse voltage. By plotting $1/C^2$ vs. V, the dopant concentration $N_D$ may be obtained from the slope of the straight line and the barrier height $\phi_{Bn}$ may be calculated as the follows:

$$\phi_{Bn} = V_i + V_n + \kappa T/q \qquad (1.6)$$

where $V_n$ is the depth of the Fermi level below the conduction band and Vi is the intercept of the voltage axis. This method is valid only when the dopant concentration in the semiconductor is uniform.

The existence of traps at the metal-semiconductor interface will affect the applicability of Equation (1.6). It has been shown that the occupation of the traps is frequency-dependent. To avoid errors caused by the traps, the test frequency must be high so that the charges of the traps cannot follow the frequency.

In the internal photoemission methods, the photoresponse measurement is an accurate and direct method of determining the barrier height $\phi_{Bn}$. When monochromatic light is incident upon a semiconductor surface, a photocurrent may be generated. The photocurrent per absorbed photon, R, as a function of the photon energy, hv, is given by the Fowler theory:

$$Rv \; (hv - hv_o)^2 \text{ for } h(v - v_o) > 3 \; \kappa T \qquad (1.7)$$

or $$\sqrt{R} \approx h(v - v_o) \qquad (1.8)$$

where $h v_o$ is the barrier height ($q\phi_{Bn}$). When the square root of R is plotted as a function of photon energy, a straight line should be obtained, and the extrapolated value on the energy axis should give directly the barrier height $\phi_{Bn}$.

For present purposes, the I–V and the C–V methods are presently preferred for measuring Schottky barrier height $\phi_{Bn}$.

There is a great need in the art relating to Schottky diodes for individual, stable Schottky diodes which utilize n-GaAs-type substrates and which have a predetermined or tunable barrier height $\phi_{Bn}$. A method for making such Schottky diodes is also needed. The ability to produce a Schottky diode with a predetermined barrier height $\phi_{Bn}$ would greatly enhance the ability of the semiconductor art to utilize such diodes particularly in the field of integrated circuit devices.

Similarly, there is a great need in the art of Schottky diodes for individual Schottky diodes having a wide range of predetermined and controlled barrier heights.

So far as now known, no one has previously described or suggested either a method for making a Schottky diode with a particular desired (or predictable) barrier height $\phi_{Bn}$ or a product Schottky diode with such a definite (or predictable) barrier height that is made by such a method.

The present invention is directed to and satisfies these needs.

BRIEF SUMMARY OF THE INVENTION

This invention relates in one aspect to processes for fabricating Schottky diodes having barrier heights in the range of about 0.6 to about 1 eV, and to the corresponding Schottky diodes made by the present processes.

Preferably, an embodiment of these processes is practiced with a monocrystalline semiconductive substrate that is comprised of a compound of the formula $$Al_v Ga_{l-v} As \qquad (2)$$

where v is a positive number ranging from and including 0 through 1 inclusive. More preferably, this substrate is gallium arsenide. Such a substrate is also preferably n-doped.

By these inventive processes, an electrically conductive metal is deposited, preferably by a sputtering procedure, upon a localized surface area of such a substrate to form a contact. This contact as deposited is comprised of an alloy (i.e., an intermetallic compound) which is characterized by having the formula:

$$[\Sigma M_\delta](Al_x Ga_{l-x}) \qquad (3)$$

where:

$\Sigma M$ is a moiety which consists of at least one M, and when more than one M is present, each M is different, M is a Group VIII metal selected from the group consisting of nickel, cobalt, ruthenium, rhodium, iridium and platinum, $\delta$ is a stoichiometric coefficient whose total value in any given $\Sigma M$ moiety is 1, and x is a positive number between 0 and 1 (that is, x ranges from greater than 0 to less than 1).

Alloys of Formula (3) when deposited as an electrical contact upon a substrate of Formula (2) form Schottky diodes as described in the above cited parent patent application Ser. No. 851,729. The Schottky diode characteristics of such a contact as deposited preferably by sputtering are improved by heat treating such a contact/substrate combination in an annealing process, such an improvement in characteristics being generally described herein as an "enhancement" for convenience.

In order to achieve enhancement of the Schottky barrier properties of such a contact/substrate combination, the contact/substrate combination must be capable of existing after annealing as a two phase equilibrium reciprocal system consisting of the binary alloy mixture:

$$[\Sigma M_\delta]Ga-[\Sigma M_\delta]Al-AlAs-GaAs \qquad (4)$$

where:

$[\Sigma M]$, M and $\delta$ each have their above defined (in reference to Formula (3)) respective meanings.

In the Schottky diode fabrication processes of this invention, the depositing of a Formula (3) alloy can be accomplished using one of several conventional techniques, such as a technique involving vapor deposition, ion implantation, sputtering (greatly preferred) or the like. The annealing can be accomplished using conventional techniques of elevated temperatures applied for periods of time.

However, in the preferred practice of the processes of this invention, the depositing (preferably by sputtering) and the annealing are accomplished under controlled conditions to achieve product Schottky diode uniformity, reproducability and performance characteristics particularly with regard to the Schottky barrier height $\phi_{Bn}$.

Schottky diodes with barrier heights falling within a predictable range can be produced by the preferred processes of this invention. In preferred process practice modes, however, individual Schottky diodes each having a predictable (that is, preselected or predetermined) barrier height $\phi_{Bn}$ are produced. Thus, after a preliminary decision or selection is made regarding a particular barrier height $\phi_{Bn}$ desired in a product Schottky diode and before the deposition procedure is undertaken, one first selects a particular starting alloy (or intermetallic compound) of Formula (3) which can achieve the selected or predetermined Schottky barrier height. The preliminary selection involves a comparison of the desired barrier height to previously prepared data (the preparation being carried out as described herein) which relates compositional variations in a selected alloy subclass of Formula (3) to variations in barrier heights $\phi_{Bn}$ under a preselected set of contact formation conditions.

A Schottky diode produced according to the preferred diode preparation practice modes of this invention has a substantially predetermined barrier height $\phi_{Bn}$. The preferred practice modes of this invention provide reproducible results and are believed to be suitable for the commercial scale production of Schottky diodes having predetermined barrier heights. The product Schottky diodes so prepared are believed to be new and inventive.

By using the alloys of Formulas (3) (which can exist in the binary form in combination with the substrate of Formula (2) as shown in Formula (4)) as electrical contacts on substrates of Formula (2) for devices of the Schottky type, the problems of the prior art regarding metal inertness and contact temperature stability are overcome. Contacts made with the present alloys display excellent Schottky barrier properties, particularly the contacts which have undergone enhancement.

The diode preparation processes of this invention and the Schottky diodes produced take advantage of the circumstance that certain alloys of Formula (3) are in equilibrium with substrates comprised of a Formula (2) compound such as gallium arsenide, or gallium aluminum arsenide. Also, contacts formed as described herein using such alloys on such substrates display a surprising capacity for Schottky barrier enhancement.

In addition, the preferred diode preparation processes of this invention take advantage of the discovery that systematic compositional changes in a given alloy of Formula (3) can produce systematic changes in Schottky barrier height $\phi_{Bn}$ without substantial alteration of a diode preparation process. Thus, Schottky diodes having various predetermined barrier heights can be prepared using a standardized preparation procedure.

In accord with the present invention, to practice such a preferred diode preparation process, a preliminary investigation is carried out of a particular starting intermetallic compound subclass that is within the scope of the class of starting intermetallic compounds of Formula (3).

The data developed in this investigation is correlated with the barrier height $\phi_{Bn}$ characteristically exhibited by individual members of a series of subclass alloy compositions of Formula (3) as deposited as respective contacts under selected conditions upon a substrate of Formula (2). The members of the series differ from one another in composition. All contacts are preferably deposited using a preferred procedure of this invention. The barrier heights $\phi_{Bn}$ of the contacts are measured and correlated with alloy composition.

From such results, it has been discovered that alloys of the Formula (3) can produce by the practice of the preferred diode preparation procedures of this invention individual Schottky diodes which each have a predetermined (or prechosen) barrier height $\phi_{Bn}$ that is typically in the range of about 0.6 to about 1 eV on monocrystalline substrates of the Formula (2) type.

Also from such results, particular processing parameters can be selected as described herein so that a product Schottky diode which has a particular preselected barrier height $\phi_{Bn}$ can be produced by practicing a particular combination of the method steps of this invention. Thus, once a preselected barrier height $\phi_{Bn}$ is selected for a desired product Schottky diode, then specific processing parameters can be used which will produce a Schottky diode with that preselected barrier height $\phi_{Bn}$.

The present invention overcomes the problems of the prior art and enables one to prepare indicated Schottky diodes having selected barrier heights $\phi_{Bn}$ within a broad range such as indicated above.

The product Schottky diodes, as those skilled in the art will appreciate, have practical applications which include incorporation into MESFETs, HEMTs, MODETs, Gunn oscillators, solar cells, various integrated circuits, and the like. The product Schottky diodes can be conventionally employed in conventional circuitry which incorporates Schottky diodes.

Schottky diodes with rectifying current-voltage characteristics are already used in the main components constituting many analog and digital electronic devices. Schottky diodes with ohmic contacts having linear current-voltage characteristics and low resistivities are already used as component interconnectors or as links between active regions and external circuits and are essential for allowing the associated electronic devices to communicate with the outside world.

Other and further objects, aims, purposes, features, advantages, conditions, embodiments, applications and the like will be apparent to those skilled in the art from the present specification taken with the accompanying drawings.

DETAILED DESCRIPTION

Figure 1:
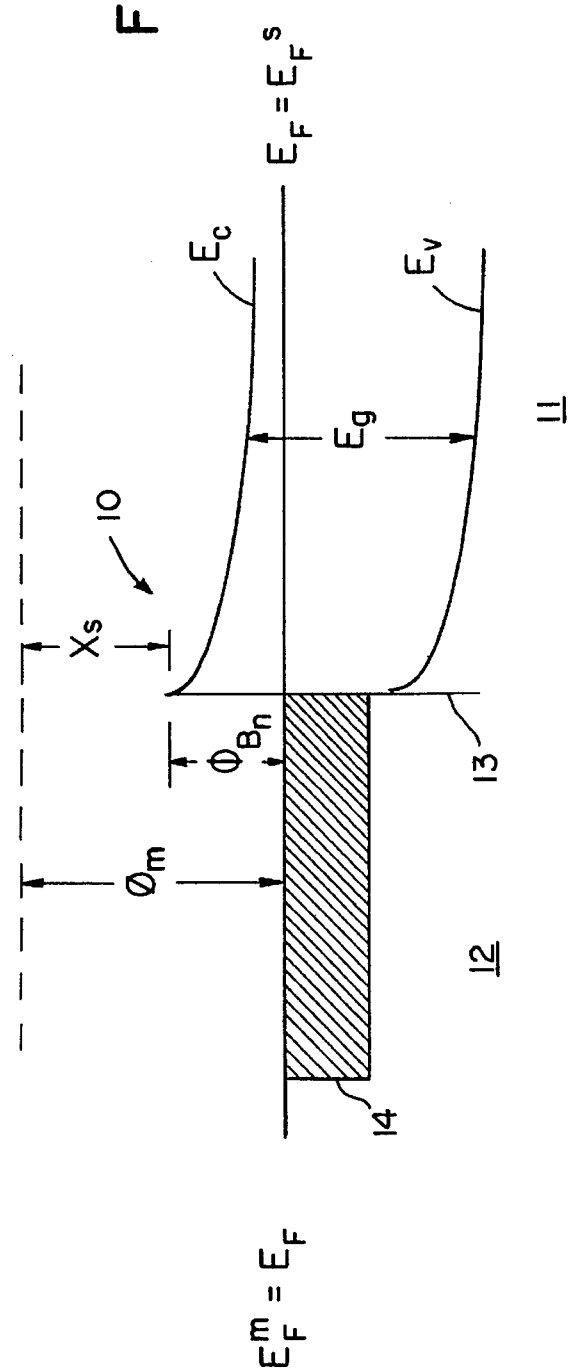
FIG. 1 shows a conventional energy band diagram for a Schottky barrier junction.

(a) Starting Materials (1) Substrates and Their Initial Preparation

The monocrystalline substrates of Formula (2) are known in the prior art and are commercially available. The dopant which produces the preferred n-type doping is relatively unimportant, but typical and illustrative dopants include Si, Ge, Se, and Te and the like. Also, the concentration of the dopant in a given substrate is relatively unimportant, but uniform substrate doping is a present preference. Typical and illustrative dopant concentrations fall in the range of about $10^{16}$ to about $10^{17}$ A/cm$^{-3}$ (for making Schottky contacts).

A presently most preferred substrate comprises n-GaAs, and a presently most preferred surface upon which to form a Schottky diode in accord with this invention lies along the 100 axis of the substrate.

The substrate is usually in the form of a wafer. Typical and illustrative wafer sizes fall in the size range of about 5 to about 10 cm in diameter and about 0.375 to about 1 mm in depth, although larger and smaller wafer sizes can be used, if desired.

In accord with the preferred practice of the process of this invention, starting wafers are carefully cleaned. Various cleaning procedures can be used. The presently preferred wafer cleaning procedure is to first immerse all wafers successively into each one of three ultrasonic baths—a first bath comprising perchloroethylene (also known as tetrachloroethylene), a second bath of acetone and a third bath of an alcohol (specifically, ethanol, methanol, or a mixture thereof) with the residence time of each wafer in each bath preferably being at least about 5 minutes.

Thereafter, the resulting wafers are each flushed with fresh deionized or distilled water for at least about 5 minutes. It is believed to be important (but for reasons that are not yet clear) for purposes of product uniformity that the bath liquids be changed frequently and also that the water used for flushing be freshly prepared when producing a plurality of Schottky diodes under the same set of controlled variables. For example, product Schottky diodes have been observed to have differing barrier heights when the wafer flush water has not been maintained in a generally freshly deionized condition.

(2) Alloys of Formula (3)

Starting alloys (or intermetallic compounds) of Formula (3) above can be either prepared preliminarily before deposition upon a substrate surface (preferred), or prepared in situ during or after deposition of component metals upon a substrate surface.

When an alloy is formed in situ, deposition is most preferably carried out by sputtering, but could be accomplished under vacuum conditions by thermal deposition, electron beam bombardment, or the like.

When a deposition procedure is carried out to achieve in situ preparation of a starting intermetallic compound, the depositing is preferably carried out by the steps of:

(a) simultaneously separately sputtering independent respective starting metals of the selected intermetallic compound, the sputtering rate for each starting metal corresponding to the amount of metal in the selected intermetallic compound; and (b) codepositing the sputtered metals to produce the selected intermetallic compound as a layer upon the predetermined area.

An intermetallic compound of Formula (3) can be preformed by any convenient procedure. However, a presently preferred alloy preparation procedure is carried out by the steps of:

(a) admixing together in finely divided form the substantially pure respective different metals of the selected intermetallic compound, the respective mole ratios thereof being such that the resulting mixture has a composition that corresponds to the selected intermetallic compound;

(b) compressing the resulting mixture under a pressure in the range of about 500 to about 800 pounds per square inch so as to form at least one pellet comprised of the resulting mixture;

(c) sealing each pellet in an inert chamber zone having an interior gas phase pressure in the range of about $10^{-3}$ to about $10^{-5}$ Torr;

(d) annealing each pellet in the chamber zone at a temperature in the range of about 1050° C. to about 1400° C. for about 30 to about 360 hours and thereafter cooling;

(e) removing each pellet from the chamber zone and pulverizing the pellet into a powder;

(f) recompressing the powder under a pressure of about 500 to about 800 pounds per square inch so as to form at least one resulting pellet comprised of the powder;

(g) sealing each resulting pellet in an inert chamber zone having an interior gas phase pressure of not more than about $10^{-4}$ Torr;

(h) reannealing each resulting pellet in the chamber zone at a temperature in the range of about 600° C. to about 800° C. for about 3 to about 30 days; and (i) quenching each annealed pellet in a liquid quench medium that is maintained at a temperature in the range of about 0° to about 5° C.

The alloys of Formula (3) together with methods for their preparation and for their use are described in the above referenced U.S. patent application Ser. No. 851,729, the disclosure and contents of which are incorporated herein by reference.

(b) The Deposition (1) General

Deposition of an alloy of Formula (3) upon a substrate of Formula (2) is, in general, carried out so that a layer of an alloy is deposited on a predetermined surface area of a selected substrate. Conventional deposition techniques can be utilized.

However, for purposes of the preferred practice of the present invention and achieving Schottky diodes having barrier heights $\phi_{Bn}$ in the range indicated above, sputtering is employed to deposit a contact comprised of an alloy of Formula (3) upon a predetermined (preferably clean) localized surface area of a monocrystalline semiconductive substrate of Formula (2).

(2) Sputtering

Sputtering is conveniently and preferably carried out using a vacuum in the range of about $10^{-10}$ to about $10^{-6}$ Torr. A present preference is to employ the sputtering equipment that is available commercially from Iontek, Inc. of Fort Collins, Colo. and to use the sputtering conditions recommended generally by this company for use with their equipment. Preferably, a sputter deposition procedure uses an ionized gas which has been accelerated under an electric or magnetic field to bombard the alloy source target, thereby "knocking off" alloy molecules in a vaporized state from a source body which vaporized molecules drift to, and deposit upon, a spatially adjacent surface of the single crystal substrate.

The sputtering is conducted in the presence of an inert Group VIIIA gas having a pressure in the range of about $10^{-3}$ to about $10^{-2}$ Torr. Presently preferred Group VIIIA gases are argon and neon.

It is much preferred to employ only a preformed selected alloy of Formula (3) in sputtering in accord with this invention.

The sputtering is continued until a layer of the alloy being sputtered is coated (deposited) on the selected substrate area.

The size and thickness of the alloy coating can vary. For example, to prepare a contact of conventional size, the localized area can be in the range of about 0.01 to about 20 mm$^2$ and the alloy deposited in this area can have a thickness in the range of about 0.05 to about 0.3 microns. For another example, to prepare a miniaturized integrated circuit component, the localized area can be in the range of about $10^{-2}$ to about $10^{-7}$ mm$^2$ and the alloy as deposited in this area can have a thickness that is not more than about 0.05 micron. Sputtering is preferably carried out under uniform conditions.

(c) Annealing

Annealing, in the preferred practice of the present invention, is carried out after the sputtering by employing a temperature in the range of about 300° to about 850° C. for a time inversely extending in the range of about 900 to about 0.5 seconds. Annealing is carried out in an oxygen-free (inert) atmosphere.

Annealing preferably is carried out in a rapid thermal annealing furnace under controlled temperature conditions in a time of not more than about 2 minutes. However, if a conventional convection furnace or the like is employed, the annealing time may be at least about 2 minutes and usually may be less than about 900 seconds. Indeed, with such a furnace, extended annealing times up to about 1 hour are possible, if desired (but are not preferred).

Alloys of Formula (3), and semiconductor device electrical contacts of this invention that are comprised thereof, are believed to be thermally stable. Thus, after being deposited on a semiconductor substrate of the class defined above and subsequently being subjected to annealing, a deposited alloy layer is believed to display no appreciable tendency to react with the substrate. For example, even after a subsequent (post annealing) exposure to a temperature of at least about 800° C. applied for a time of at least about 10 minutes, no appreciable change in the contact alloy or in the semiconductor electrical properties appears to have occurred.

After alloy deposition upon a substrate, the alloy deposit or layer, particularly when in the form of a localized electrical contact, is preferably overcoated with a layer of tungsten before annealing. The thickness of the tungsten layer can vary. A present preference is to vapor deposit (preferably by sputtering) a tungsten layer of about 10 to about 20 nm in thickness over an alloy layer although thicker and thinner tungsten layers may be used, if desired. The tungsten layer provides a smoother surface morphology and better capacity for achieving electrical contact exteriorly (as with a contacting wire or the like) for reasons which are not yet altogether clear.

(d) Product and Product Characteristics

As those skilled in the art will readily appreciate, in making an electrical contact, an alloy of Formula (3) is typically deposited only on a predetermined localized area of a substrate surface. To achieve this result, it is presently preferred to employ a photolithographic procedure. Thus, the predetermined surface region of the substrate is conveniently coated with a layer of a conventional photoresist composition, such as, for example, one which is commercially available under the trade designation "MF-321."

The so called substrate surface is then covered by a conventional EBES (electron beam exposure system) mask or the like. The mask is characteristically opaque except for a pattern of circular or elongated holes therein which are arranged at predetermined locations. Ultraviolet light is impinged against the mask to image the photoresist layer in the hole area(s). The resulting imaged layer is then contacted with a conventional developer solution. After development, the imaged hole area(s) on the substrate surface are exposed to alloy vapors while the adjacent areas remain covered by a layered deposit of developed photoresist material. The resulting selectively and locally alloy coated substrate surface is then removed from the deposition chamber and placed in a solution which removes the layered deposit of photoresist composition, but which leaves the locally deposited areas of alloy on the desired location(s) of the substrate surface.

It is theorized (and there is no intent herein to be bound by theory) that, during the annealing, interdiffusion occurs to a very limited extent in the interfacial region between the alloy and the substrate surfaces, but that such interdiffusion is insufficient to substantially alter desired electrical properties since the thin locally deposited alloy layer and the adjacent substrate portions are each near, and remain in, thermodynamic equilibrium.

The interdiffusion results in the creation of an identifiable metallic semiconductive interlayer in a region located between the substrate and the alloy. This interlayer is believed to have a thickness that is characteristically in the range of about 80 to about 105 Å. The chemical composition of this interlayer is not fully known for each of the various possible contacts which can be formed using a Formula (3) compound on a Formula (2) substrate. However, it is now believed that this interlayer typically and usually contains the metals aluminum, gallium and arsenic.

In any given embodiment, the relationship between the alloy which was deposited by sputtering and the associated substrate, and between the sputtering conditions and the annealing conditions, is such that after the annealing the interlayer is present. The interlayer itself may be and in fact apparently usually is characterized by having more than one component layer, the exact identity of each individual such component layer being influenced by the chemical components present in the substrate and in the deposited alloy layer and by the processing conditions. The exact identity of these component layers for each of the possible interlayers is not now known.

In a given product diode embodiment, characteristically, when a negative bias voltage in the range of about 0 to about −10 volts is applied between an exterior surface of the contact and a portion of the substrate that is adjacent to, but spaced from, the contact by the interlayer, then substantially no current flows through the region of the interlayer (i.e., through the interlayer). However, characteristically, when a positive bias voltage in the range of about 0.1 to about 0.7 volts is so applied, then a current in the range of about $10^{-7}$ to about 0.5 milliamperes flows through the region of the interlayer (i.e., through the interlayer).

In a typical device that incorporates a Schottky diode type contact of this invention, the substrate has at least one first metallic electrical contact electrode that is in electrically conducting association with one surface of this substrate, and this first electrode is comprised of an alloy of Formula (3) which has been processed in accord with the teachings of this invention. In addition, this substrate has at least one second metallic electrical contact electrode that is in electrically conducting association with one surface of this substrate, and each of the second electrodes is in spaced, adjacent relationship relative to the first electrode. Also, each of such second electrodes is comprised of an ohmic metal (that is, a metal that displays uniform resistance when varying amounts of current and voltage are passed therethrough).

Preferably the substrate is comprised of gallium arsenide, although suitable substrates also include, for example, aluminum arsenide and aluminum gallium arsenide. Preferred first contact electrodes are comprised of preferred alloys of this invention. One class of preferred devices of this invention are those which are thermally stable after being annealed and reheated to at a temperature of at least about 800° C. for at least about 10 minutes.

Ohmic metals known to be prior art may be used. Examples of suitable ohmic metals include indium, an alloy of gold and germanium, an alloy of gold, germanium, and nickel, and the like.

Figure 2:
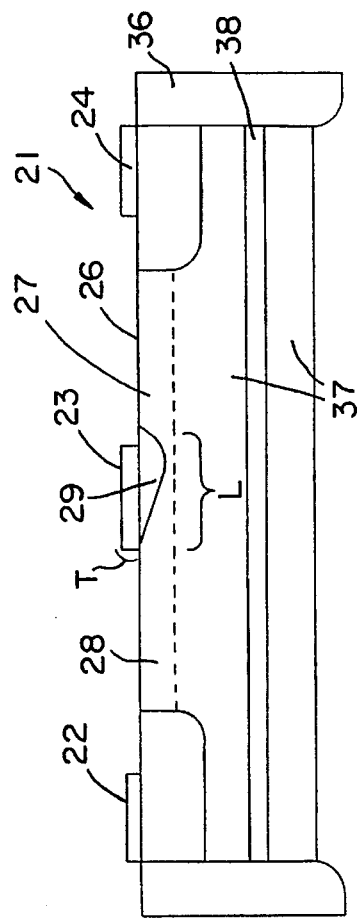
FIG. 2 is a diagrammatic prospective fragmentary vertical sectional view of one embodiment of a device of the present invention which incorporates an electrical contact comprised of an alloy of Formula (3)

Referring to FIG. 2, there is seen an illustrative embodiment of a solid state integrated circuit (IC) device which utilizes an alloy of Formula (3) as a component electrical contact thereof. Here, an n-channel depletion mode GaAs MESFET device 21 is shown in a simplified, schematic, vertical, cross-sectional view. Device 21 incorporates source 22, gate 23 and drain 24 electrodes (or contacts) in a spaced, adjacent relationship to one another on a common surface 26 of a GaAs single crystalline substrate 27. Gate 23 is comprised of a least one alloy of this invention and has a gate length L typically ranging between about 0.5 and 1.0 μm (micrometers) and a gate thickness T typically ranging between about 0.1 and 0.2 μm in thickness. However, larger and smaller lengths and thicknesses can be used, if desired. A gate 23 so formed of an alloy of Formula (3) displays characteristically the voltage dependent resistance or rectifying characteristics that are characteristic of Schottky barrier layers and Schottky diodes generally.

The source 22 and drain 24 contacts can have similar dimensions. These contacts can be comprised of metals or alloys previously used in the prior art of GaAs MESFETS and which characteristically display constant resistance, and exhibit linear I–V behavior, as is characteristic of prior art ohmic contacts. For example, these contacts can be comprised of an alloy of Au/Ge/Ni (gold/germanium/nickel), or the like.

Conduction takes place in a surface-adjacent channel 28 within substrate 27 whose thickness is variable, but is believed to be typically in the range of about 0.75 to about 1 μm. The gate contact 23 forms a Schottky barrier with the channel 28. When zero bias is applied to gate 23, the inherent or built-in voltage of the barrier depletes a portion of the channel 28 of material carriers, as illustrated by region 29 in FIG. 2. When gate 23 has a positive bias applied thereto with respect to the channel 28, the depletion region 29 is narrowed and the channel 28 is more conductive.

However, at some voltage, which is typically about 0.7 V (volts) in a prior art MESFET device, a significant forward current begins to flow in the Schottky diode and no further increase in channel 28 conductance is obtained. When gate 23 has a negative bias applied thereto with respect to the channel 28, the thickness of the depletion region 29 increases until it extends through the entire thickness of the channel 28, and the channel 28 conductance declines to zero.

In the MESFET device field, the bias voltage at which the foregoing occurs is sometimes known as the "pinch-off" voltage. The MESFET device 21 is typically peripherally surrounded by a zone 36 that is doped with a conventional isolation implant and the GaAs substrate 37 beneath layer 27 is semi-insulating. If desired, a layer 38 can be positioned in substrate 37 to provide a conventional insulating barrier.

The threshold voltage for a depletion mode MESFET device of this invention is now believed to be in the range of about −0.3 to about −3V, and to be in the range of about 0 to about +0.3V for an enhancement mode MESFET device of this invention, which ranges are similar to corresponding prior art MESFET devices.

However, when the gate 23 is comprised of an alloy of this invention, a MESFET of this invention (compared to a prior art MESFET) can be annealed at a higher temperature (up to about 800° C.) than a MESFET of the prior art. Thus, the dopants in regions 31 and 32 are fully activated. Also, series resistances through gate, source, and drain regions are reduced. The MESFET of this invention also runs at a higher clock speed, if desired, compared to prior art MESFETs.

The alloys of Formulas (3) are also useful in modified MESFET devices, such as, for example, the so called high electron mobility transistor (HEMT) which is also called MODET (for modulation doped field effect transistor). Alloys of Formulas (3) avoid the reduced temperature limitations associated with prior art HEMTs so that significant speed improvement at relatively high operation temperatures (compared, for example, to MESFETs) is achievable.

Figure 3:
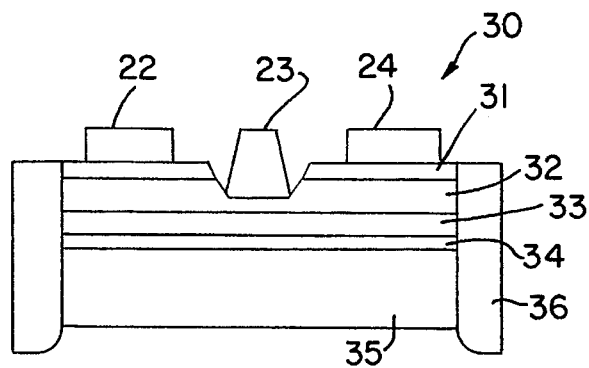
FIG. 3 is a view similar to FIG. 2 but showing another device embodiment.

A cross sectional view of a HEMT 30 is shown in FIG. 3. Here, as in the FIG. 2 embodiment, the source, drain and gate electrodes are designated by the respective numbers 22, 24 and 23 and are each comprised of similar alloys. Layer 31 is typically from 0 to about 1 nm in thickness and is comprised of $n^+$ doped GaAs. Layer 32 is similar in thickness and is comprised of $n^+$ doped AlGaAs. Layer 33 is of similar thickness and is comprised of undoped AlGaAs. Layer 34 is of similar thickness and is comprised of GaAs which has been doped. Layer 35 is thicker and is comprised of undoped GaAs. The HEMT 30 is conveniently surrounded peripherally by a zone 36 that is doped with a conventional isolation implant.

Thus, in HEMT 30, a heavily doped AlGaAs layer 32 is placed adjacent to an undoped AlGaAs channel layer 33. Because electron potential energy is lower in the layer 33, electrons "fall" into the lightly doped channel 33. In layer 33, electron mobility is higher due to the lower doping level.

At room (ambient) temperatures and above, the HEMT has a mobility advantage over the MESFET.

(e) Device Fabrication

The electrical contacts provided by depositing and annealing an alloy of Formula (3) upon a substrate as characterized herein can be incorporated into a wide variety of solid state devices, as those skilled in the art will appreciate. Examples include Schottky-barrier diodes, MESFETs, HEMTs, and other devices employing metal contacts as the gate electrodes or Schottky barriers.

A device of this invention incorporating an enhanced alloy of Formula (3) as a surface electrical contact on a gallium arsenide (GaAs) semiconducting substrate is believed to be characterized by superior high temperature stability, increased yield and improved reliability. Shallower functions and reduced contact resistance are achieved. The existing (prior art) yield of GaAs devices of not over about 50% is substantially increased by the alloy/GaAs contacts of the present invention.

One class of product devices comprises transistors where, in each transistor, a first portion of the substrate assembly is a collector and a second portion of the substrate assembly is an emitter. At least one of the contacts is in electrically conducting association with the collector and at least one other of the contacts is in electrically conducting association with the emitter.

A Schottky barrier diode made with a GaAS substrate and an alloy contact of Formula (3) as the Schottky barrier can be used in combination with conventional ohmic contacts, such as contacts comprised of indium, gold-germanium, or the like. The substrate is conventionally doped n- beneath the alloy contact, and beneath the ohmic contact the substrate is conventionally doped $n^+$.

Schottky barrier diodes, as those skilled in the art will appreciate, can be either the vertical type or the horizontal type. The following exemplary vertical type diode structure is illustrative:

(1) Starting material: n- type, (100) oriented, medium Te or Si-doped (approximately $3 \times 10^{-17}$), preferably about 1 to one-side polished GaAs substrate.

(2) Cleaning: GaAs wafers are degreased in trichloroethylene (TCE) using an ultrasonic cleaner followed by two acetone rinses for about 5 minutes each. The wafers are subsequently rinsed by deionized (DI) water. The wafers are then rinsed in about a 1:5 solution of HCi:DI water for about 2 minutes followed by a 5 minute rinse in deionized water to remove the native oxide.

(3) Thin-film deposition: An alloy of Formula (3) or (4) is deposited on the front opposed side of each wafer by sputtering using a procedure such as earlier described herein. Indium is deposited on the back side of the wafer to be an ohmic contact.

(4) Heat-treatment: The wafers are heat-treated at about 200° C. to form an ohmic contact on the backside of the wafers. The wafers are then annealed at elevated temperatures to activate the dopants. In this invention, this temperature can be high as about 800° C. with a good yield being achieved for the devices thus made.

(5) Lithography: The front side of each wafer is photolithographically processed by standard lithography procedures. Diodes thus made have typical dimensions in the range of about 150 to about 1200 microns. Smaller diodes can also be made, if desired.

The fabrication of, for example, an embodiment of a planar n-channel GaAs MESFET of this invention, such as shown in FIG. 2, involves many of the same process steps that are used with silicon integrated circuits (ICs) including substrate cleaning, oxidizing, masking, etching, implanting, annealing, metalizing and dicing. These steps have been previously used in the manufacture of prior art MESFETs and so are known to the prior art.

Because of the desire to achieve high speed operational capability for a GaAs MESFET of this invention which employs a contact comprised of an alloy of Formula (3), the fabrication methods used are preferably optimized and the minimum dimensions used are preferably about 1 μm or less. The basic simplicity of the MESFET structure facilitates control of such small geometries, but the production of commercially acceptable delineation, reproducible line widths and adequate alignment accuracy requires accurate microlithographic techniques including such techniques as reduction projection photolithography with direct on-wafer stepping, direct writing E-beam pattern generation and/or x-ray replication. Since gallium arsenide wafers and chips are commonly more fragile than those of silicon, they preferably have smaller diameters, such as about 2 or 3 inches.

To fabricate a GaAs MESFET of this invention, a set of masks can be employed as follows.

Mask 1 for implanting channel doping. Silicon or selenium is implanted as the dopant to a level of about $10^{17}$ $A/cm^{-3}$ for the conducting channels of the MESFETs which results in a final sheet resistance of the indepleted channel of about 1,000 to about 2,000 ohms per square.

Mask 2 for source and drain doping. A sulfur implantation is common for the $n^+$ source and drain contact regions producing a sheet resistance of about 100 to about 200 SL per square. A controlled thermal anneal cycle at about 800° C. to about 850° C. electrically activates the first two implants.

Mask 3 for ohmic contacts. Areas where ohmic metal makes contact to source and drain doped areas of the substrate are defined. Suitable prior art metal alloys are identified above.

Mask 4 for isolation area doping. Isolation of adjacent IC devices is achieved by implanting ions of hydrogen or boron in regions between adjacent devices with the result that resistivity in the isolation regions is increased.

Mask 5 for gate contacts and connections thereof with source and drain contacts. The Schottky barrier gates and connections between such gates and source and drain contacts are made with an alloy of this invention that is initially deposited over the entire surface of the masked wafer. Mask 5 removes all metal except in gate areas and in connections to sources, gates and drains.

Mask 6 for contact windows. The wafer is covered with an insulating layer of $SiO_2$ or $Si_3N_4$. Windows are opened over all desired connection areas.

Mask 7 for metal interconnections. A second layer of conventional ohmic metal or alloy is deposited over the entire surface of the wafer. The final mask patterns this metal to produce the desired circuit connections. After wafer probing and dicing, the devices are ready for packaging, storage or use.

The fabrication procedure for making a HEMT device such as shown in FIG. 3 is substantially more complex than the fabrication procedure for making a MESFET device of FIG. 2, involving molecular beam epitaxy (MBE) and metal-organic chemical vapor deposition (MOCVD) to form the alternating layers of GaAS and AlGaAs each with greatly different respective doping concentrations relative to one another.

To make a HEMT, the following procedure is suitable:

(1) Starting material: wafer of semi-insulating single crystalline GaAs substrate (Cr-doped).

(2) Cleaning: very similar to that described for Schottky barrier diode.

(3) Thin-film deposition of GaAs and AlGaAs: use either MBE or CVD. For MBE, the procedure can start with the oxide decomposition at about 580° C. at ultra-high vacuum for about 5 minutes. The temperature of the substrates is then raised to about 630° C. to about 700° C. and deposited onto the substrate of the same stack, as shown in FIG. 3.

(4) Thin-film deposition of alloys of Formula (3): Such an alloy is deposited onto the stack produced by the preceding deposition procedure of (3) preferably by sputtering. The gate portion of the wafer is masked by a photoresist layer. Other parts of the alloy are etched out. An ohmic metal layer (such as In or Au-Ge-Ni) is deposited on the whole wafer face. Source and drain regions are masked by photoresist, and other parts of the ohmic alloy are etched out. Removal of the photoresist reveals a shape such as shown in FIG. 3.

In a MESFET device of this invention, the substrate is preferably coated with a first doped layer comprised of $n^+$ doped AlGaAs and the first metallic contact electrode is formed on the first doped layer. Also, in spaced adjacent relationship to the first contact electrode, the first doped layer is coated with a second doped layer comprised of $n^+$ doped GaAs, and the first one and the second one of each of the two second metallic contact electrodes are both formed on the second doped layer.

It is distinct feature and advantage of this invention that the alloys of Formula (3) can, if desired, be used in prior art semiconductor device fabrication techniques that have previously been employed in the manufacture of integrated circuits and solid state devices.

(f) Predictable Schottky Barrier Heights

Many two-phase equilibrium systems exist that are derivable from an intermetallic compound of Formula (3) and a substrate comprised of a Formula (2) compound and that corresponds to (i.e., satisfies) the reciprocal system of Formula (4) (after annealing). Whether or not such a reciprocal system exists for any particular species combination of Formula (3) alloy and Formula (2) substrate is readily determined by routine, conventional examination of a phase diagram for such a particular reciprocal system, as those skilled in the art will readily appreciate.

Figure 5:
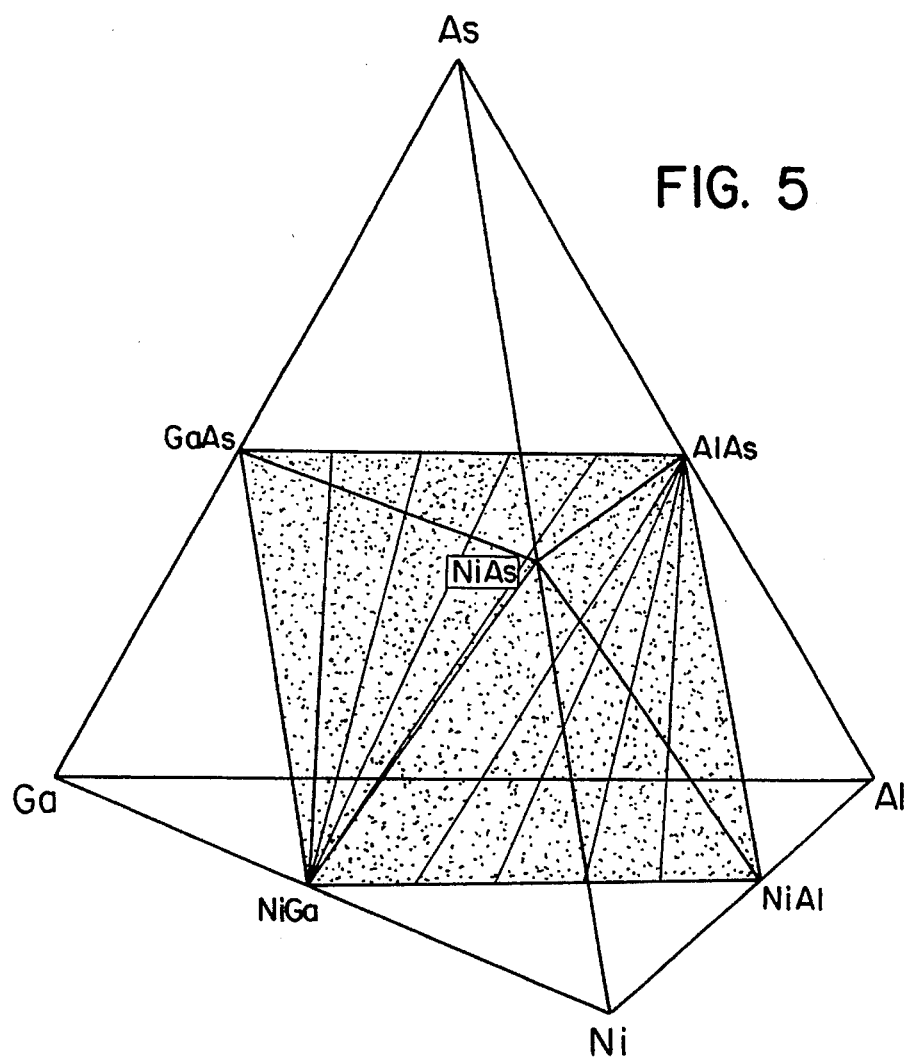
FIG. 5 is a schematic phase diagram of a Ni-Al-Ga-As quaternary showing a reciprocal system GaAs-NiGa-NiAl-AlAs.

The phase equilibria of, for example, a quaternary system such as Ga-Ni-Al-As are more complex than the phase equilibria of a ternary system, such as Ni-Ga-As, Al-As-Ga, Al-Ga-Ni, or Ni-Al-As. However, GaAs and AlAs are known to be highly stable thermodynamically (i.e., they have large negative Gibbs energies of formation). Moreover, evaluation shows that they form a series of solid solutions. Most of the B2 phases are also rather stable thermodynamically and many of them appear to form continuous solid solutions. Since the lattice parameters of NiGa and NiAl are nearly the same, they are capable of forming a series of continuous solid solutions. A two-phase equilibrium exists between Ni(GaAl) and (GaAl)As in the exemplary quaternary system. In essence, there exists a reciprocal system consisting of GaAs-NiGa-NiAl-AlAs for a Formula (7) subclass and a GaAs substrate. Accordingly, it is necessary to deal only with the thermodynamics and kinetics of this portion of the complete quaternary Ga-Ni-Al-As system which is shown the schematic diagram of FIG. 5. The FIG. 5 diagram shows that the reciprocal system GaAs-NiGa-NiAl-AlAs is an isoplethal section of a Ni-Al-Ga-As quaternary. In FIG. 5, irrelevant binary intermetallic compounds are omitted for the purpose of clarity.

Figure 6:
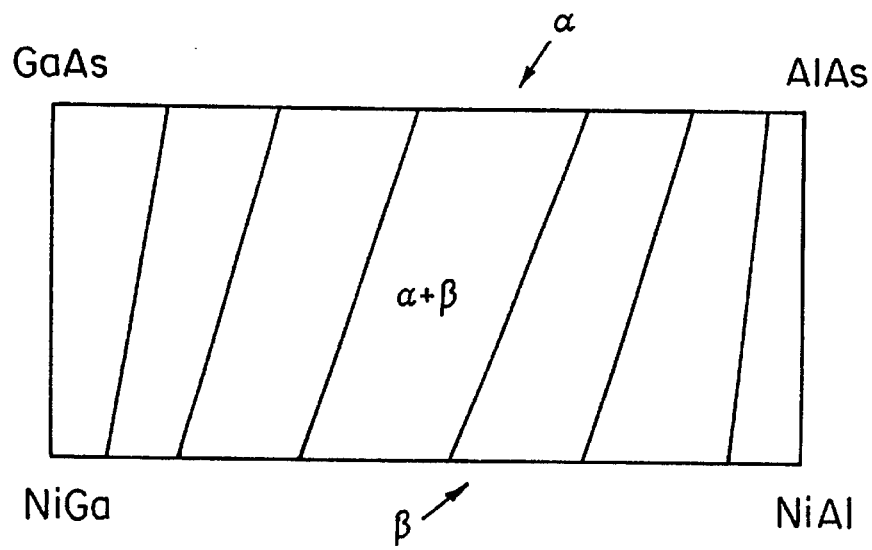
FIG. 6 shows a phase diagram of the reciprocal system GaAs-NiGa-NiAl-AlAs at constant temperature and pressure.

In FIG. 6, there is seen the phase diagram of the illustrative reciprocal system GaAs-NiGa-NiAl-AlAs at constant temperature T and pressure P. As illustratively shown in FIG. 6, there exists two solid solutions. They are (Ga, Al)As, designated as $\alpha$ and Ni(Ga,Al), designated as $\beta$. The $\alpha$-phase has the structure that is characteristic of ZnS (B3), and the $\beta$-phase has the structure that is characteristic of CsCl (B2). When the solubilities of Ni in $\alpha$ and of As in $\beta$ are neglected, these two phases may be treated as pseudobinary solid solutions of GaAs and AlAs and NiGa and NiAl, respectively. The two-phase equilibrium between $\alpha$ and $\beta$ may be represented by the following chemical reaction:

$$NiGa(\beta)+AlAs(\alpha)=NiAl(\beta)+GaAs(\alpha) \qquad (5)$$

Measurement of the Schottky barrier height of a contact formed under controlled conditions with alloys of Formula (3) upon a monocrystalline substrate of Formula (2) shows that the ratio of Ga to Al in a Formula (3) alloy, which alloy has the capacity to exist as a two phase reciprocal system as indicated in Formula (4), is indirectly proportional to the Schottky barrier height $\phi_{Bn}$ of the contact. The Schottky barrier heights $\phi_{Bn}$ are conveniently measured by the I-V and C-V techniques (as defined above herein). In general, alloys of Formula (3) are now believed to produce Schottky barrier heights $\phi_{Bn}$ in the approximate range of about 0.6 to about 1 eV using the contact formation procedures involving sintering and annealing as disclosed herein.

The present invention provides the ability to preselect (and thereby predict) the barrier height $\phi_{Bn}$ of a desired Schottky diode wherein the Schottky contact is formed from an alloy of Formula (3) on a substrate of Formula (2). Using a selected substrate, one preliminarily correlates systematic variations in barrier height $\phi_{Bn}$ and a series or subclass of starting alloys of Formula (3) which systemically vary in chemical composition from one another. The starting alloy series employed corresponds to the alloy series that will be subsequentially used in preparing Schottky diodes. Initially, for a given alloy series, data is produced or is producable which provides a replicatable and reliable correlation between alloy composition and Schottky barrier height $\phi_{Bn}$. This data is then used in selecting a particular alloy within the alloy series which produces a desired Schottky diode contact having a preselected or predicted barrier heights $\phi_{Bn}$ using preferably standardized sputtering and annealing conditions within the ranges described herein.

Based on available data, this predictability is believed to be associated with the formation of an interface between the contact layer and the substrate when the annealing methodology of this invention is practiced. This interface, depending upon the variables involved, can have a variable composition and internal structure but contains Al, Ga and As typically. Based on available data this interface is believed to have a thickness in the range of about 80 to about 105 Å.

It is theorized (and there is no intent to be bound by pure theory herein) that the Al may be the primary factor controlling Schottky barrier height $\phi_{Bn}$ and that the barrier height $\phi_{Bn}$ using the compounds of Formulas (2), (3) and (4) can be controlled (predetermined) by using different combinations of substrate and alloy. The Schottky barrier height $\phi_{Bn}$ can be tailored given the fact that Fermi pinning exists.

The present invention thus provides a process for producing a Schottky diode having a particular desired barrier height $\phi_{Bn}$ upon a monocrystalline semiconducture substrate that is comprised of a compound of the Formula (2). This process involves the initial steps of:

(a) selecting a substrate comprised of a composition from Formula (2) and an alloy subclass from Formula (3) (with the feature of Formula (4)); and (b) determining the correlation between representative alloys of said subclass and the respective barrier heights $\phi_{Bn}$ that are associated with contacts produced therefrom upon the substrate of Formula (2) under preferably controlled conditions of sputtering and annealing as described herein.

In the practice of present invention, any suitable and convenient procedure may be used to determine (i.e., identify) the correlation between (a) the value of x (interrelating Al and Ga as shown in Formula (3)) for a given selected subclass of Formula (3) wherein [$\Sigma M_\delta$] is preferably fixed (or effectively so), and (b) the corresponding value of $\phi_{Bn}$ (the measured barrier height associated with Schottky barrier contacts on a particular Formula (2) monocrystalline substrate where the various contacts are produced from different respective species members of the selected subgroup or subclass of Formula (3)). Two techniques for identifying this correlation are illustratively provided herein. In the technique identified as (I) herein for convenience, the correlation is identified by an empirical procedure using selected compositionally different (preferably systematically different) members of a chosen alloy subclass of Formula (3) wherein x in this subclass is varied and a (preferably) constant contact formation procedure is used as provided herein so that each selected alloy species of the subclass is used to produce a contact whose barrier height $\phi_{Bn}$ is measured. From the resulting data, one can estimate the barrier height $\phi_{Bn}$ that will be produced by any single possible alloy species of the subclass when formed into a contact by using the contact formation procedure or one can estimate the barrier height $\phi_{Bn}$ that will be produced by any alloy species of the subclass when that species is used in the contact formation procedure to make a Schottky diode.

In the technique identified as (II) herein for convenience, the correlation is identified by calculations based on certain equations and on certain measurements involving phase equilibrium determinations and bulk diffusion measurements for representative species member compositions of a chosen alloy subclass of Formula (3) wherein x is varied. The value of x for a species alloy composition with the subclass which will produce a particular barrier height $\phi_{Bn}$ is thus identified.

Independently of the technique of determining the correlation, subsequently, the correlation is employed to produce Schottky diodes having a predicted (i.e., predetermined) barrier height $\phi_{Bn}$. Procedurally, one selects a desired barrier height $\phi_{Bn}$ to be associated with a Schottky diode contact that is to be formed on the same (or approximately the same) substrate as used in establishing the above indicated correlation. This selected barrier height $\phi_{Bn}$ is compared to the above indicated correlation (which can be done with the correlation being in any convenient form, such a graphical, tabular or machine readable form). Using the correlation, one alloy composition within the selected subclass is chosen which, from the correlation, is known to produce a Schottky diode contact having the desired barrier height $\phi_{Bn}$ upon such substrate using a predetermined set of processing conditions. Preferably, these conditions approximate, and are more preferably substantially identical to, a set of conditions that was employed in initially evaluating the individual member compositions of the selected Formula (3) subclass and in identifying the correlation between subclass compositions and barrier heights $\phi_{Bn}$. Once a given barrier height $\phi_{Bn}$ is selected, the comparing of the selected barrier height to the correlation information, the selecting of a species alloy within the selected subclass, and the contact formation process on a given substrate can be carried out automatically, if desired, with the aid of computerized controls.

The Schottky diode production conditions preferably involve sputtering the contact upon a predetermined localized surface area of a selected monocrystalline semiconductive substrate comprised of a Formula (2) compound. The sputtering is preferably carried out at a base pressure which is in the range of about $10^{-16}$ to about $10^{-6}$ Torr and in the presence of an inert Group VIII gas having a pressure in the range of about $10^{-3}$ to $10^{-2}$ Torr. The sputtering is continued until a layer of desired thickness of the alloy is coated upon the area.

Thereafter, the substrate and the coating are annealed preferably at a temperature in the range of about 300° to about 850° C. for a time inversely extending in the range of about 900 to about 0.5 seconds.

In a preferred Schottky diode preparation process of this invention where a Schottky diode having a predicted (or prechosen) barrier height $\phi_{Bn}$ is to be prepared upon a doped monocrystalline substrate comprised of a Formula (2) compound using a Schottky contact derived from an intermetallic compound of Formula (3), one preliminarily selects a subclass of Formula (3). In this subclass, the value of x is variable and both Al and Ga are present.

The subclass is preferably chosen so that all members of the subclass have the same compositional identity for [$\Sigma M_\delta$] (that is, all members of the subclass have the same Group VIII metal or metals, as identified (defined) above in the definitions for $\Sigma M$, M and $\delta$ provided with Formula (3) above).

If, for example, as taught in Ser. No. 851,729, [$\Sigma M_\delta$] has the formula [$M^1_y M^2_{1-y}$] wherein $M^1$ and $M^2$ are different from one another, but each M is a Group VIII metal as defined in Formula (3), then y is a positive number ranging from and including 0 through 1 (preferably, y is greater than 0 and less than 1).

If, for another example, as also taught in Ser. No. 851,729, [$\Sigma M_\delta$] has the formula [$M^1_y M^2_z M^3_{1-y-z}$] wherein $M^1$, $M^2$ and $M^3$ are different from one another, but each M is a Group VIII metal as defined above in Formula (3), then y is a positive whole number from and including 0 through 1, z is a positive whole number from and including 0 through 1, and the sum of y, z and [1-y-z] in any compound is always 1 (preferably y and z are each a value in the range of greater than 0 to less than 1).

Values for y and z when such are present in a subclass Formula (3) alloy now appear to have either a relatively negligible or substantially insignificant but fixed effect upon the $\phi_{Bn}$ value of a contact in a Schottky diode that is formed with such an alloy. Among alloys of Formula (3) wherein [$\Sigma M_\delta$] is comprised of more than one M metal, one presently preferred subclass is characterized by the formula:

$$Ni_y Co_{1-y} Al_x Ga_{1-x} \qquad (6)$$

where y is a user selected positive number in the range from greater than 0 to less than 1 and x is a positive number in the range from greater than 0 to less than 1.

However, it is presently preferred to employ in practicing a preferred Schottky diode preparation process of this invention a subclass alloy of Formula (3) wherein [$\Sigma M_\delta$] is a single Group VIII metal of the class indicated in the definition of M in Formula (3) above and 6 is 1. It is presently most preferred to employ as the single Group VIII metal Ni in a subclass of Formula (3).

Also, in the case of an alloy subclass of Formula (3), the subclass is preferably chosen so that, as between different individual alloy compositions of this subclass, the relative respective amounts of Al and Ga vary in relation to each other. For example, when $[\Sigma M_S]$ is Ni, the subclass has the Formula (7) (below).

Because of the stable nature of an alloy Formula (3) in relation to a substrate comprised of a semiconductor of Formula (2), the composition of such an alloy can be correlated with the barrier height $\phi_{Bn}$ of the contact formed therewith. When, for example, comparable, preferably substantially identical, contact formation conditions are used for forming a plurality of contacts from a species alloy of Formula (3) having a particular composition, Schottky diodes are producable in accord with the invention wherein the individual contacts each have about the same predetermined barrier height $\phi_{Bn}$ which is correlated with its alloy composition.

Correlation Technique (I) is further understood and exemplified by using the illustrative reciprocal system GaAs-NiGa-NiAl-AlAs. Thus, as shown in the Examples 1–5 below, the Schottky barrier heights $\phi_{BN}$ of various contacts comprised of a series of Formula (3) subclass alloys are measured using controlled formation conditions. This subclass is characterized by the following subgeneric formula:

$$Ni(Ga_xAl_{1-x}) \tag{7}$$

where x is as above identified in Formula (3). Each selected species is individually formed into a contact upon a Formula (2) substrate comprised of n doped monocrystalline GaAs. The barrier height $\phi_{Bn}$ of each contact is measured by the I–V and/or C–V techniques. These contacts are formed by using a procedure as described herein of sputtering followed by annealing. Specifically, it is found that contacts wherein x is 0.0, 0.25, 0.5, 0.75 and 1.0 produce a wide systematic variation of Schottky barrier heights $\phi_{Bn}$ in the range of about 0.66 to about 0.96 eV. In effect, the Schottky barrier height $\phi_{Bn}$ is found to increase continuously in this range as x decreases.

The interfacial stability between the Ni(GaAl) contacts and GaAs is examined and confirmed by Scanning Auger Microscopy (SAM).

The observed modulation or systematic change in the Schottky barrier height $\phi_{Bn}$ and the interface stability are found to be explained by a thermodynamic and kinetic analysis of the GaAs-NiGa-NiAl-AlAs system.

Apart from the above described and below exemplified empirical procedure of Technique (I) for developing comparative data regarding the barrier heights $\phi_{Bn}$ produced by respective individual members of a composition series of a subclass of Formula (3) for use in preparing Schottky diodes of predetermined barrier height $\phi_{Bn}$, one can estimate Schottky diode barrier $\phi_{Bn}$ by a direct correlation analysis using Technique (II).

Technique (II) is made possible by using certain theoretical considerations plus phase equilibrium determinations and bulk diffusion measurements applicable to a selected subclass of Formula (3). In general, based on present information, this direct approach of Technique (II) tends to produce a correlation between x in starting alloy subclass member compositions and corresponding product Schottky diode barrier heights $\phi_{Bn}$ that appears to result in less precise achievement of a desired and controlled final barrier height $\phi_{Bn}$ than is obtained by the empirical procedure of Technique (I) (in terms of, for example, achieving an accurate contact barrier height $\phi_{Bn}$ in a given product Schottky diode compared to a preliminarily selected (or desired) barrier height for that product Schottky diode).

Correlation Technique (II) is also further understood and exemplified by using the same illustrative reciprocal system GaAs-NiGa-NiAl-AlAS. The direct analysis takes account of the circumstance that, in the reaction of Equation (5) above, the change in the Gibbs energy of the reaction is $$\Delta°G = \Delta \cdot G_{f,NiA_1} + \Delta \,°G_{f,GaAs} - \Delta \cdot G_{f,NiGa} - \Delta° \cdot G_{f,AlAs} \tag{8}$$

where the $\Delta°\phi G_{f,s}$ are the Gibbs energies of formation of the four component binary phase here expressed in terms of one mole of Ga(Al)As or NiAl(Ga). Assuming that $\alpha$ and $\beta$ behave ideally, then:

$$\Delta°G = -RT\ln\frac{x^\beta(1-x^\alpha)}{(1-x^\beta)x^\alpha} \tag{9}$$

where:

R is the gas constant

T is the temperature, and $x^\alpha$ and $x^\beta$ are the mole fractions of AlAs in $\alpha$ and of NiAl in $\beta$.

The assumption of ideal behavior for $\alpha$ and $\beta$ is not serious in some cases, such as solutions between GaAS and AlAs and between NiGa and NiAl, where the lattice parameter differences are small. For these cases, the exchange of Ga and Al takes place on the respective sublattices of $\alpha$ and $\beta$ with little interaction. Rearrangement of Equation (9) yields the following relationship:

$$x^\beta = \frac{1}{1-(1-1/x^\alpha)/K} \tag{10}$$

where K is $\exp(-\Delta°G/RT)$. K may be considered to be a thermodynamic factor. From Equation (10), it is obvious that, if values of K are known, then the tie-line distribution in the $\alpha+\beta$ two-phase field is readily calculated. When the solution behavior is now ideal, the tie-line distribution may be obtained numerically since an explicit equation relating $x^\alpha$ and $x^\beta$ is not available. Values of the solution parameters for $\alpha$ and $\beta$ must be known independently. However, they can be obtained from a knowledge of the tie-line distributions. These tie-lines must be determined experimentally.

From Equation (10), the following equations can be derived:

$$x^\alpha = \frac{Kx^\beta}{K+(1-K)x^\beta} \tag{11}$$

and $$\frac{x^\alpha}{1-x^\beta} = \sqrt{\frac{D^\beta}{D^\alpha}} \tag{12}$$

where K is as above defined and $D^\alpha$ and $D^\beta$ are diffusivities of the $\alpha$ and $\beta$ phases, respectively. Equation (12) may be considered to be a kinetic factor. Available data indicates that $D^\alpha$ is about $10^{-7}$ cm$^2$/sec and that $D^\beta$ is about $10^{-13}$ cm/sec. From this information, the Equations (11) and (12) are solved to obtain a value for the interface composition $x^\alpha$.

Then, the value for $x^\alpha$ is substituted into an empirically derived equation that relates $\phi_{Bn}$ values to $x^\alpha$ values in a particular alloy subclass of Formula (3) that is under consideration (such as Formula (7)) for use in making Schottky diode contacts on a Formula (2) substrate. This equation takes into account the fact that the relationship between the value of x in a given subclass of Formula (3) and the $\phi_{Bn}$ of contacts made therewith can be regarded as being linear at least over a limited working range. This empirical equation can be derived in various ways or from the literature. For example, in the illustrative reciprocal system GaAs-NiGa-NiAl-AlAs that is based on Formula (7) alloys and a GaAs substrate, this empirical equation can be derived from (a) available literature or (b) data points for species alloy compositions and respective measured specific values of $\phi_{Bn}$ obtained from Schottky diode contacts made therewith. Using only literature, the following empirical equation was determined:

$$F(x^\alpha) = 0.6 + 0.6 x^\alpha = \phi_{Bn}^{I-V} \qquad (13)$$

Thus from the value for $x^\alpha$, an estimate for $\phi_{Bn}$ is obtained by Equation 13. Various methods for fitting an empirical equation to a set of data points or a plot are well known to the prior art.

Figure 7:
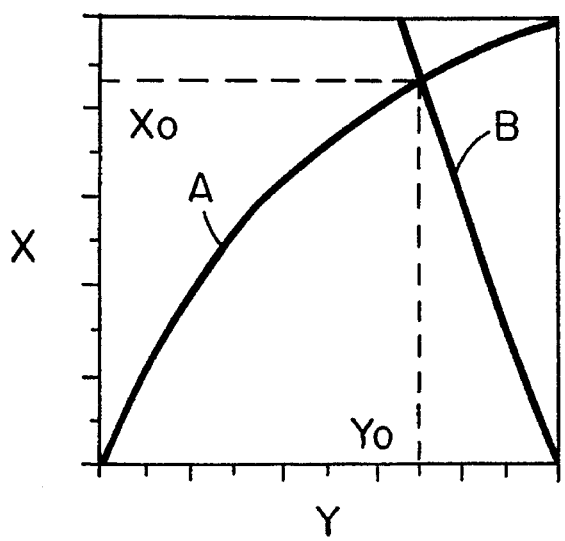
FIG. 7 shows a plot showing the relationship between X and Y for each of two curves (A and B), each curve involving a different aspect of the interrelationship between two solid solutions in the exemplary reciprocal system GaAs-AlAs-NiGa-NiAl, these curves at their point of common intersection being used to estimate the interface concentration in such reciprocal system, X being the mole fraction of AlAs in (Ga,Al)As and Y being the mole fraction of NiAl in Ni(Ga,Al)

For the exemplary reciprocal system GaAs-NiGa-NiAl-AlAs, the X-axis in the plot of FIG. 7 is the Al concentration in $\alpha$ and the Y-axis is the Al concentration in $\beta$; here, $X = x^\alpha$ and $Y = x^\beta$. The solution (AlGaAs) of the tie lines is given by the equation:

$$X = \frac{k_T Y}{k_T + (1 - R_T) Y} \qquad (14)$$

The relationship of the interface concentrations is given by:

$$\frac{x}{1-Y} = \sqrt{\frac{D^\beta}{D^\alpha}} \qquad (15)$$

Figure 8:
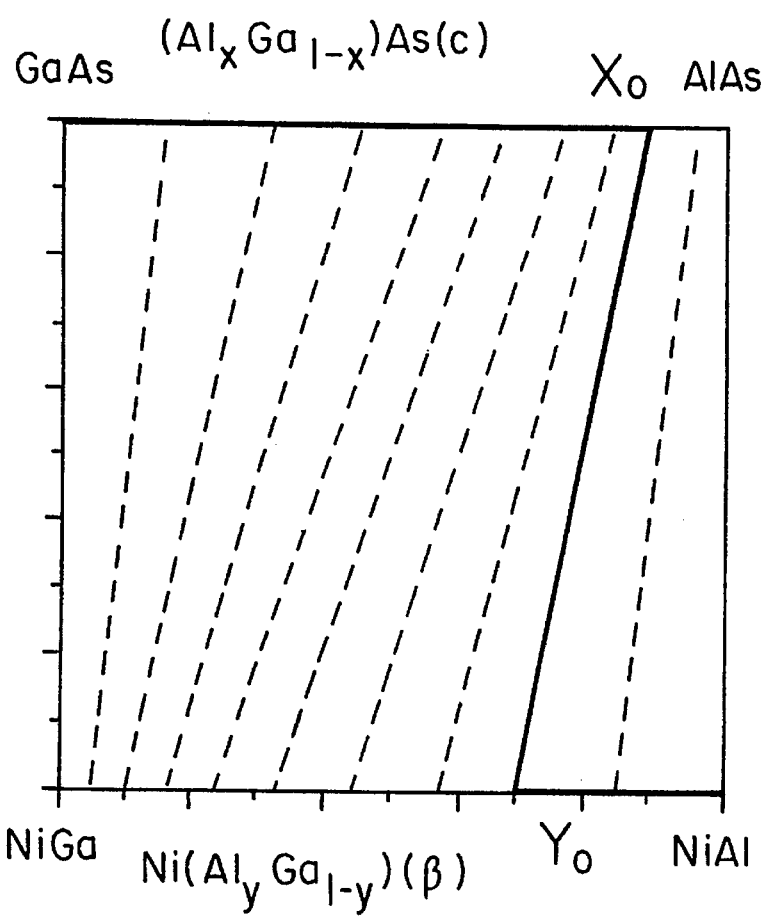
FIG. 8 shows usage of the X and Y values identified by the intersection point in FIG. 7 to establish a particular diffusion path in the exemplary system GaAs-NiGa-NiAl-AlAs and to estimate Schottky barrier height $\phi_{Bn}$.

In FIG. 7, curve A is derived from Equation 13 and curve B is derived from Equation 14. Thus, the interface concentration at $X_o$ and $Y_o$ is determined. From this concentration, a diffusion path is established in which $X_o$ determines the Schottky barrier height, as illustrated in FIG. 8 for the exemplary system.

Hence, as can be seen from the foregoing discussion, for a given exemplary reciprocal system, the barrier height $\phi_{Bn}$ can be estimated by Technique (II) using theoretical considerations and a series of preliminary measurements to provide the data needed for estimating by the theoretical equations what specific composition to use for obtaining a given barrier height $\phi_{Bn}$ in a product Schottky diode. For the presently observed reasons of accuracy, and reliability, however, as those skilled in the art will appreciate, the empirical procedure of Technique (I) is presently preferred for use in practicing the barrier height $\phi_{Bn}$ engineering processes of this invention.

EMBODIMENTS

The following Examples further illustrate the invention:

EXAMPLES 1–5

Correlation between Alloy Composition and Schottky Barrier Height $\phi_{Bn}$ for a Formula (5) Subclass Alloy The subclass alloy of Formula (7) is here employed with a n-GaAs substrate.

Unintentionally doped ($\approx 3 \times 10^{16}$ Acm$^{-3}$) n-GaAs wafers with a (100) orientation were used as substrates. The samples were degreased with trichlorethylene (TCE), acetone, and methanol for 5 minutes each. The degreased wafers were then patterned with an array of 0.5 mm diameter dots using a standard lithographic technique. Prior to Ni(Al, Ga) deposition, the patterned samples were cleansed in 10% by volume NH$_4$OH in de-ionized H$_2$O, followed by blow drying with N$_2$. 100 nm thick Ni(Al,Ga) contacts were deposited by sputter deposition at an Ar pressure of 4 m Torr in a base pressure of $2 \times 10^{-7}$ Torr. The different alloy compositions of Ni(Al,Ga) with Formula (7) for use as sputtering targets were made by hot pressing of different ratios of NiAl and NiGa intermixed powders in the manner described in Examples 1.1–1.3 of copending U.S. patent application Ser. No. 851,729. Annealing was carried out in a rapid thermal annealing furnace at temperatures ranging from 325° C. to 600° C. for about 20 seconds.

I–V measurements were performed with a Keithley model 236 electrometer and C–V characteristics were measured with a Keithley model 590 capacitance analyzer.

The ideality factor, n, which is an indication of the deviation of the contact from ideal thermionic emission behavior has to be close to 1 to assure the applicability of the above Equation (1.1).

(Results and Discussion)

$\phi_{Bn}^{I-V}$, $\phi_{Bn}^{C-V}$ and the ideality factor n for the individual Ni(Ga$_x$Al$_{1-x}$) alloys formed on the n-GaAs substrates (with x = 0.0, 0.25, 0.5, 0.75 and 1.0) after annealing at different temperatures are shown in Table I (below):

TABLE I $\phi_{Bn}^{I-V}$, $\phi_{Bn}^{C-V}$ and the ideality factor n for Ni(Ga$_x$Al$_{1-x}$)/n-GaAs diodes with x = 0.0, 0.25, 0.5, 0.75 and 1.0 at different annealing temperatures.

| Ex. No. | Alloy of Formula (7) | as-deposited | 325° C./120 sec | 400° C./60 sec | 500° C./20 sec |
|---|---|---|---|---|---|
| 1 | NiAl | $\phi_{Bn}^{I-V} = 0.837$<br>$\phi_{Bn}^{C-V} = 0.95$<br>n = 1.03 | $\phi_{Bn}^{I-V} = 0.9$<br>$\phi_{Bn}^{C-V} = 0.98$<br>n = 1.05 | $\phi_{Bn}^{I-V} = 0.96$<br>$\phi_{Bn}^{C-V} = 1.15$<br>n = 1.06 | $\phi_{Bn}^{I-V} = 0.94$<br>$\phi_{Bn}^{C-V} = 1.17$<br>n = 1.09 |
| 2 | NiGa$_{.25}$Al$_{.75}$ | $\phi_{Bn}^{I-V} = 0.82$<br>$\phi_{Bn}^{C-V} = 0.918$<br>n = 1.04 | $\phi_{Bn}^{I-V} = 0.9$<br>$\phi_{Bn}^{C-V} = 0.97$<br>n = 1.05 | $\phi_{Bn}^{I-V} = 0.95$<br>$\phi_{Bn}^{C-V} = 1.12$<br>n = 1.09 | $\phi_{Bn}^{I-V} = 0.93$<br>$\phi_{Bn}^{C-V} = 1.19$<br>n = 1.13 |
| 3 | NiGa$_{.5}$Al$_{.5}$ | $\phi_{Bn}^{I-V} = 0.8$<br>$\phi_{Bn}^{C-V} = 0.89$<br>n = 1.06 | $\phi_{Bn}^{I-V} = 0.89$<br>$\phi_{Bn}^{C-V} = 0.95$<br>n = 1.09 | $\phi_{Bn}^{I-V} = 0.93$<br>$\phi_{Bn}^{C-V} = 1.04$<br>n = 1.05 | $\phi_{Bn}^{I-V} = 0.92$<br>$\phi_{Bn}^{C-V} = 1.3$<br>n = 1.09 |
| 4 | NiGa$_{.75}$Al$_{.25}$ | $\phi_{Bn}^{I-V} = 0.8$<br>$\phi_{Bn}^{C-V} = 0.89$<br>n = 1.07 | $\phi_{Bn}^{I-V} = 0.86$<br>$\phi_{Bn}^{C-V} = 0.94$<br>n = 1.11 | $\phi_{Bn}^{I-V} = 0.88$<br>$\phi_{Bn}^{C-V} = 0.96$<br>n = 1.15 | n > 1.2 |
| 5 | NiGa | $\phi_{Bn}^{I-V} = 0.76$ | $\phi_{Bn}^{I-V} = 0.74$ | $\phi_{Bn}^{I-V} = 0.68$ | $\phi_{Bn}^{I-V} = 0.66$ |

TABLE I-continued $\phi_{Bn}^{I-V}$, $\phi_{Bn}^{C-V}$ and the ideality factor n for Ni(Ga$_x$Al$_{1-x}$)/n-GaAs diodes
with x = 0.0, 0.25, 0.5, 0.75 and 1.0 at different annealing temperatures.

| Ex. No. | Alloy of Formula (7) | as-deposited | 325° C./120 sec | 400° C./60 sec | 500° C./20 sec |
|---|---|---|---|---|---|
| | | $\phi_{Bn}^{C-V}$ = 0.86<br>n = 1.04 | $\phi_{Bn}^{C-V}$ = 0.85<br>n = 1.04 | $\phi_{Bn}^{C-V}$ = 0.9<br>n = 1.08 | $\phi_{Bn}^{C-V}$ = 0.8<br>n = 1.06 |

It can be seen from Table I that the Schottky barrier heights $\phi_{Bn}$ of Ni(Ga$_x$Al$_{1-x}$)/n-GaAs diodes reach their maximum at about 400° C., except for the diodes with x=1. The barrier heights increase continuously from 0.77 to 0.96 eV as x decreases from 1.0 to 0.0 at 400° C. These results are consistent with the combined thermodynamic and kinetic model, discussed elsewhere in the literature (see C. H. Jan, Ph.D. Thesis, University of Wisconsin, Madison, Wis. (1991)) and Y. A. Chang, in "Advanced Metallization and Processing for Semiconductor Devices and Circuits-II," *Mat. Res. Soc. Symp Proc.*, 260 (1992)) and show that the Schottky barrier height can be varied systematically by varying the composition of the Ni(Ga,Al) contacts. In the present study, it was found that the $\phi_{Bn}$ values were smaller than the $\phi_{Bn}$ values. This kind of discrepancy between $\phi_{Bn}$ and $\phi_{Bn}$, has also been observed in the literature (see T. Okumura and K. N. Tu, *J. Appl. Phys.*, 61, 2955 (1987)), may be due to various reasons. One reason is that the effective interface area for C–V measurements is different from that for the I–V measurements. The area will have more influence on C–V results than on the I–V results. Interface traps caused by annealing, which affect only the C–V measurements, may be a second reason.

The $\phi_{Bn}$ measured at 500° C. may be lower than that at 400° C. either because the interfacial oxides start to decompose or because Ni atoms diffuse into GaAs at that temperature. The same reasons can be applied to those samples annealed at temperatures higher than 500° C., which are not shown in the Table I because their ideality factors are greater than 1.2, which implies that the transport mechanism is not pure thermionic emission.

Figure 4A:
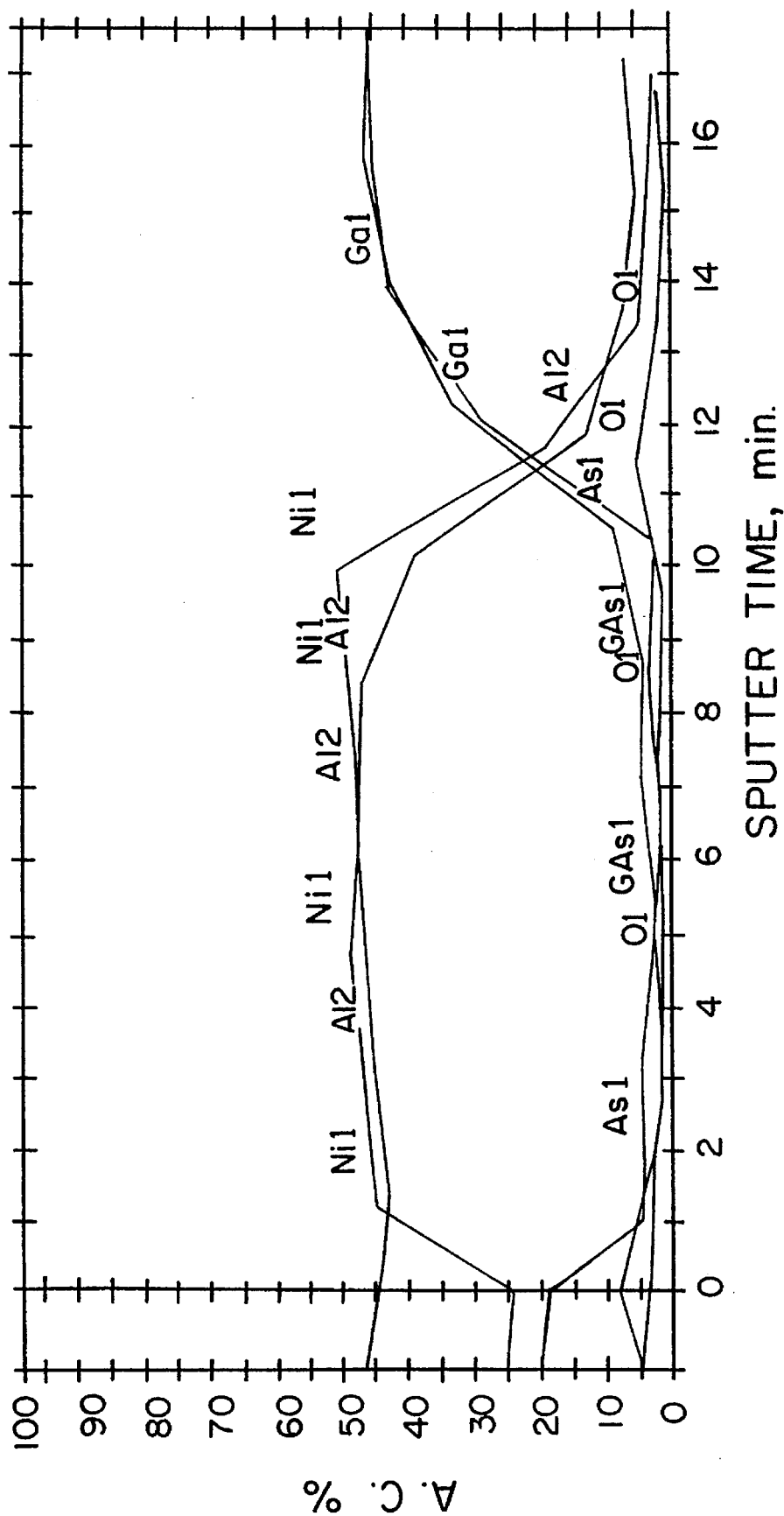
FIGS. 4A and 4B each show a plot of A.C. % versus sputter time in minutes for auger depth probes of NiAl alloy on a n-GaAs substrate with FIG. 4A showing as-deposited samples, and FIG. 4B showing samples after annealing at 500° C. for 20 seconds.
Figure 4B:
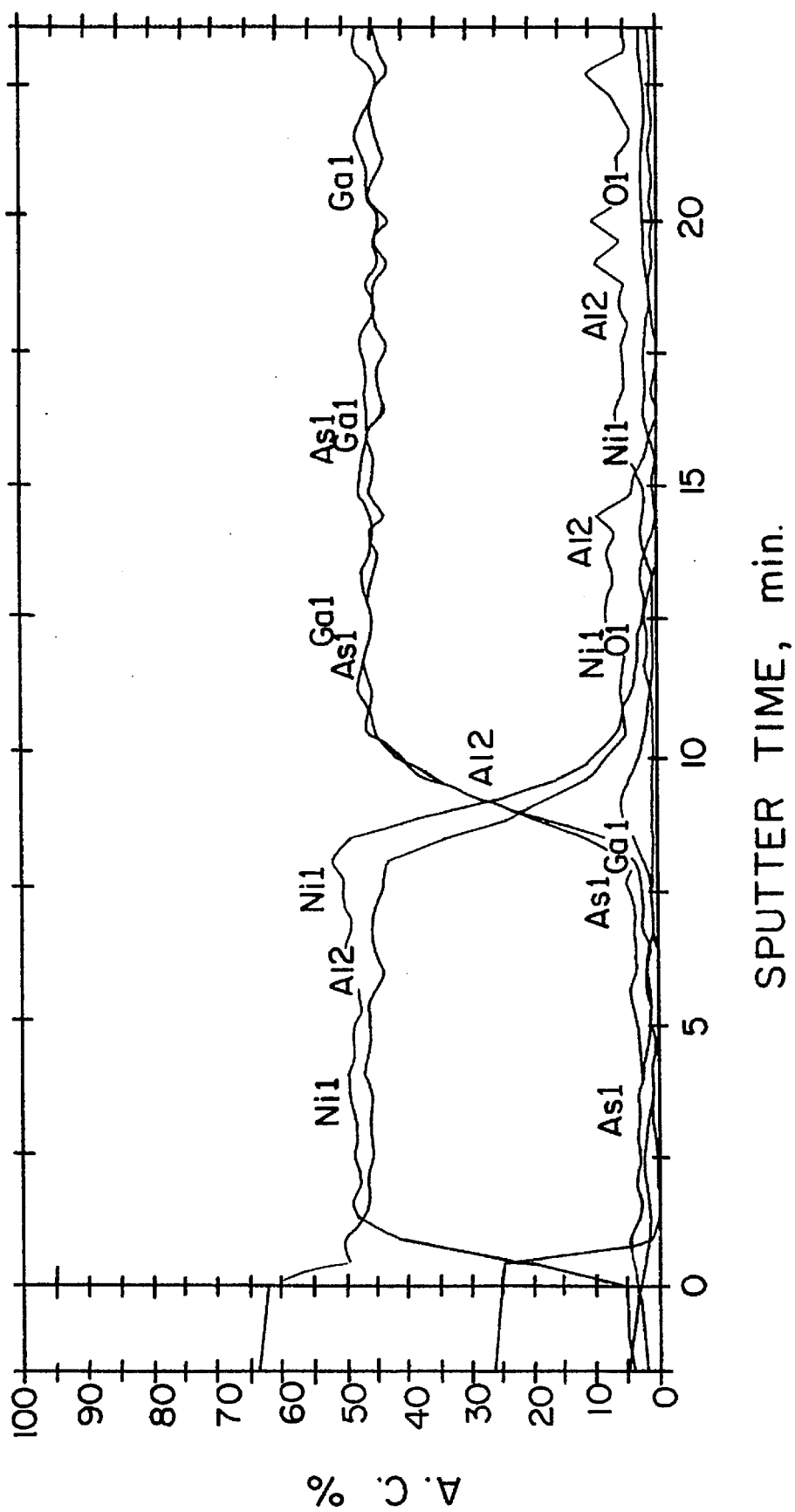

The Auger depth profiles of NiAl/GaAs diodes for the as-deposited and annealed samples are shown in FIGS. 4A and 4B. It may not be easy to tell the difference between FIG. 4A and 4B. However, using a very slow sputtering rate, one can use a special function of the computer which is connected to the SAM to see that Ni, Ga and As atoms are present at the interface between NiAl/GaAs for the as-deposited samples (FIG. 4A). Employing the same method as above, one can see that Ni, Al, Ga and As atoms are present at the interface of the annealed NiAl/GaAs samples; the thickness of reaction layer is about 90 Å for these samples (FIG. 4B). Phases are observed to be formed at the interfaces.

The leakage current density for the as-deposited sample at a reverse bias of 1 V is 7.54×10$^{-8}$ (A/cm$^2$) and for the sample annealed at 400° C. is 8.6×10$^{-9}$ (A/cm$^2$). The orders of magnitude of the leakage currents are the same as for other Ni(Ga,Al) contacts. In other words, the Ni(Ga,Al) contact is a very good contact to n-GaAs for Schottky diode purposes.

From the preceding data, one finds that Ni(Al,Ga) has several features which make it attractive as a Schottky contact to n-GaAs. One feature is that the annealing temperature required to enhance the Schottky barrier height, 400° C., is practical for IC processing. The small leakage current, which is good for IC devices, is yet another feature. Furthermore, an epitaxial layer of NiAl can be grown on n-GaAs.

Figure 9:
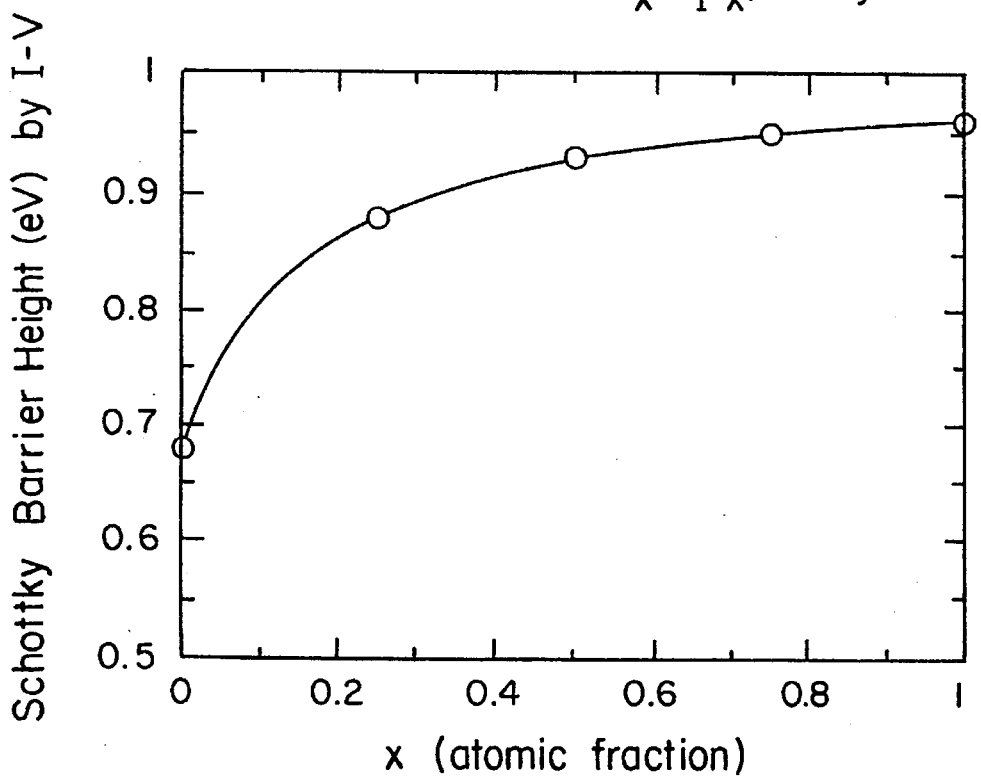
FIG. 9 is a plot showing the relationship between (a) x in $Ni(Al_xGa_{1-x})$ where x is as defined in Formula (5) and (b) Schottky barrier height $\phi_{Bn}$ in electronvolts (eV) as measured by the I–V method using a substrate and conditions as described in Examples 1–5 (below).

Plotting the data in Table I results in a curve as shown in FIG. 9 which fits the following empirical approximate equation (16). Equation (16) interrelates $\phi_{Bn}$ and the value of x in the Formula (7):

$$\phi_{Bn}^{I-V}=0.3247x/(0.1538+x)+0.68. \tag{16}$$

EXAMPLE 6

Correlation Between Alloy Composition and
Schottky Barrier Height $\phi_{Bn}$ for a Formula (6)
Subclass Alloy The subclass alloy of Formula (6) is here employed.

A series of alloys within the scope of Formula (6) are prepared as described in Example 1–5 in which the values of x and y in Formula (6) are varied. Schottky diodes using these alloys are prepared by the procedure described in Examples 1–5. It is found that changes in the value of y had little, or in some instances, substantially no significant, impact upon the barrier height $\phi_{Bn}$ of Schottky diodes made with such alloys. It is also found that changes in the value of x can have a significant impact upon the barrier height $\phi_{Bn}$ of Schottky diodes made with such alloys.

Another series of alloys within the scope of Formula (6) are prepared in which a constant value for y is maintained but in which values for x were systematically varied in the manner taught in Examples 1–5. These alloys were similarly deposited as in Examples 1–5 to form contacts upon n-GaAs wafers by sputtering followed by annealing at different temperatures. Measurements by I–V and C–V of the barrier heights $\phi_{Bn}$ of the resulting Schottky diodes were made. A similar progressively changing pattern of $\phi_{Bn}$ values and ideality factors in relation to changes in values for x is observed compared to the observations made in Examples 1–5.

Plotting the correlation data results in a curve that fits the following empirical approximate Equation (17). Equation (17) interrelates $\phi_{Bn}$ and the value of x in the Formula (6):

$$\phi_{Bn}^{I-V}=0.325x/(0.1538+x)+0.72. \tag{17}$$

EXAMPLE 7

Preparation of Schottky Diodes each having a
Predetermined Barrier Height $\phi_{Bn}$ and made using
Contacts of Formula (5) Alloys To evaluate the correlation data resulting from the procedure of Examples 1–5, a series of Schottky diodes are preliminarily selected wherein individual members of the series differ from each other in their respective predetermined (desired) barrier heights. Thus, for each barrier height $\phi_{Bn}$ selected, a particular corresponding alloy composition of Formula (5) is identified wherein that alloy composition's particular value of x is identified. Thereafter, each alloy composition so identified is prepared (if not already at hand) by the procedure of Example 1–5 and then is used as the starting alloy in a sputtering/annealing procedure substantially the same contact preparation conditions as employed in Examples 1–5 to prepare Schottky diodes.

It is found that the product Schottky diodes each have a barrier height $\phi_{Bn}$ which closely approximates the desired barrier height $\phi_{Bn}$ value that was preliminarily selected. It is also found that a plurality of Schottky diodes that are prepared using the same selected alloy, substrate, and substantially identical contact preparation conditions all had approximately the same barrier height $\phi_{Bn}$ value. It is concluded that Schottky diodes of predictable barrier heights $\phi_{Bn}$ can be prepared by this procedure and that the empirical Equation (16) is usable to produce replicatable results.

EXAMPLE 8

Preparation of Schottky Diodes having a Predetermined Barrier Height $\phi_{Bn}$ and made using Contacts of Formula (6) Alloys The procedure of Example 7 is repeated except that the correlation data resulting from the procedure of Example 6 is used with alloy compounds of Formula (6). Results similar to those obtained in Example 7 are obtained (but with respect to Equation (17)). Similar conclusions are drawn.

EXAMPLE 9

Preparation of Schottky Diodes having a Predetermined Barrier Height $\phi_{Bn}$ Schottky diodes are prepared each having a predetermined (desired) barrier height $\phi_{Bn}$. The procedure of contact formation identified in Example 1–5 is employed with the substrate being as there identified. Individual alloys of Formula (5) are selected which correspond to the respective desired barrier heights $\phi_{Bn}$. The selection is made using the comparative analysis that involves using the Equations above described particularly in reference to FIGS. 7 and 8 together with the necessary measurements of alloy properties that are needed for using such Equations. It is found that the respective product Schottky diodes approximated the (desired) predetermined barrier height $\phi_{Bn}$ but tended to deviate from the (desired) predetermined barrier height in a manner generally found to be poorer approximations of barrier height $\phi_{Bn}$ compared to the results obtained in Example 7. Perhaps "fine tuning" of the measurements could be useful in improving this correlation procedure.

Other and further embodiments will be apparent to those skilled in the art. No undue limitations are to be drawn from the foregoing description.

What is claimed is:

1. A process for producing a Schottky metal contact for a Schottky diode upon one surface of a monocrystalline semiconductive substrate wherein the interrelationship between the resulting combination comprised of said metal contact and said substrate is such that said combination has a Schottky barrier height $\phi_{Bn}$ that is in the range of about 0.6 to about 1 eV, said method comprising the steps of:

(a) sputtering a contact upon a localized surface area of a monocrystalline semiconductive substrate which is comprised of a compound of the formula:

$$Al_vGa_{1-v}As$$

where v is a positive number ranging from and including 0 through 1 inclusive.

said contact being comprised of an alloy of the formula:

$$\{\Sigma M_\delta\}(Al_xGa_{1-x})$$

where:

$\Sigma M_\delta$ is a moiety which consists of at least one M, and when more than one M is present, each M is different, M is a metal selected from the group consisting of nickel, cobalt, ruthenium, rhodium, iridium and platinum, $\delta$ is a stoichiometric coefficient whose total value in any given $\Sigma M_\delta$ moiety is 1, and x is a positive number that ranges from greater than 0 to less than 1;

said alloy having the capacity when in combination with a substrate compound as defined above to exist as a two phase binary equilibrium reciprocal system having the formula:

$$\{\Sigma M_\delta\}Ga-\{\Sigma M_\delta\}Al-AlAs-GaAs$$

where:

$\Sigma M_\delta$, M and $\delta$ are as defined above, said sputtering being continued until a layer of said alloy is coated on said area; and (b) annealing said substrate at a temperature in the range of about 300° C. to about 850° C. for a selected time, the relationship between said alloy and said substrate and said sputtering and said annealing being such that after said annealing:

a metallic semiconductive interlayer is defined in a region located between said substrate and said alloy, said interlayer has a thickness in the range of about 80 to about 105 Å, and said interlayer contains aluminum, gallium and arsenic; thereby to produce said contact upon said substrate, wherein, after said contact is produced, said contact has a Schottky barrier height $\phi_{Bn}$ that is in said range of about 0.6 to about 1 eV, and wherein prior to said sputtering, the following steps are carried out:

(1) correlating for each one of a series of alloys of one subclass of said alloy formula whose members differ from one another in composition the respective barrier height $\phi_{Bn}$ of each said contact produced therefrom on said substrate under controlled conditions of said sputtering and said annealing, and then (2) selecting a prechosen Schottky barrier height and comparing said prechosen Schottky barrier height $\phi_{Bn}$ to said correlation so that one alloy of said one alloy subclass which produces said prechosen barrier height is identified, and then (3) using said identified one alloy of said one alloy subclass to produce said contact upon said selected substrate.

2. The process of claim 1 wherein said localized area has a size in the range of about 0.01 to about 20 mm² and said alloy is coated during said sputtering on said area to a thickness in the range of about 0.05 to about 0.3 micron.

3. The process of claim 1 wherein said localized area has a size which is in the range of about $10^{-7}$ to about $10^{-2}$ mm² and said layer of said alloy has a thickness which is not more than about 0.05 micron.

4. The process of claim 1 wherein said annealing is carried out in a rapid thermal annealing furnace within a time of not more than about 2 minutes.

5. The process of claim 1 wherein said annealing is carried out in an annealing oven using a time of at least about 2 minutes.

6. The process of claim 1 wherein said series of alloys of said subclass is characterized by having the subclass series formula:

$$Ni(Al_xGa_{1-x})$$

where x is as defined above, said substrate comprises n-GaAs, and the relationship between product barrier height $\phi_{Bn}$ and said subclass series formula is represented by the empirical approximate equation:

$$I-V\ \phi_{Bn}^{I-V}=0.3247x/(0.1538+x)+0.68.$$

7. The process of claim 1 wherein said series of alloys of said subclass is characterized by having the subclass series formula:

$$Ni_yCo_{1-y}Al_xGa_{1-x}$$

where y is a positive number in the range from greater than 0 to less than 1 and x is as defined above, said substrate comprises n-GaAs, and the relationship between product barrier height $\phi_{Bn}$ and said subclass series formula is represented by the empirical equation:

$$\phi_{Bn}^{I-V}=0.325x/(0.1538+x)+0.72.$$

8. A process for producing a Schottky diode having a desired barrier height $\phi_{Bn}$ upon a monocrystalline semiconductive substrate that is comprised of a compound of the formula:

$$Al_vGa_{1-v}As$$

where v is a positive number ranging from and including 0 through 1 inclusive, said process comprising the steps of:

(a) selecting an alloy subclass from the following class of alloys:

$$\{\Sigma M_\delta\}(Al_xGa_{1-x})$$

where:

$\Sigma M_\delta$ is a moiety which consists of at least one M, and when more than one M is present, each M is different, M is a metal selected from the group consisting of nickel, cobalt, ruthenium, rhodium, iridium and platinum, $\delta$ is a stoichiometric coefficient whose total value in any given $\Sigma M_\delta$ moiety is 1, and x is a positive number between 0 and 1 and which said alloy subclass has the capacity in combination with said substrate to exist as a two phase binary equilibrium reciprocal system of the formula:

$$\{\Sigma M_\delta\}Ga-\{\Sigma M_\delta\}Al-AlAs-GaAs$$

where:

$\Sigma M_\delta$, M and $\delta$ are as defined above, (b) determining the correlation between representative member alloys of said subclass and the respective barrier heights $\phi_{Bn}$ that are associated with contacts produced therefrom upon a substrate of the formula $Al_vGa_{1-v}As$, and then (c) selecting a barrier height $\phi_{Bn}$ for a Schottky diode;

(d) comparing said selected barrier height $\phi_{Bn}$ to said correlation and selecting with said correlation one alloy composition which is within said alloy subclass and which will produce a contact having said selected barrier height $\phi_{Bn}$ upon said substrate; and (e) producing with said one alloy composition said contact upon said substrate by a process step sequence of sputtering followed by annealing.

9. The process of claim 8 wherein said steps (d) and (e) are carried out automatically after said step (c) is completed.

10. The process of claim 8 wherein said determining is carried out by the steps of:

(a) preparing members of a series of alloys which are members of said subclass and wherein said member alloys have compositions which differ from one another systematically;

(b) producing a contact comprised of each one of said member alloys of said series on said substrate by said process step sequence;

(c) measuring the barrier height $\phi_{Bn}$ of each produced said contact; and (d) comparing each said measured barrier height $\phi_{Bn}$ to said member composition employed in forming same, thereby to establish said correlation.

11. The process of claim 8 wherein said determining is carried out by making phase equilibrium determinations and bulk diffusion measurements for said representative member alloys and then estimating from said determinations and said measurements the barrier height $\phi_{Bn}$ of a contact formed from each said representative member alloy on said substrate, thereby to establish said correlation.

12. A process for producing a Schottky metal contact for a Schottky diode upon one surface of a monocrystalline semiconductive substrate wherein the interrelationship between the resulting combination comprised of said metal contact and said substrate is such that said combination has a Schottky barrier height $\phi_{Bn}$ that is in the range of about 0.6 to about 1 eV, said method comprising the steps of:

(a) sputtering a contact upon a localized surface area of a monocrystalline semiconductive substrate which is comprised of a compound of the formula:

$$Al_vGa_{1-v}As$$

where v is a positive number ranging from and including 0 through 1 inclusive, said contact being comprised of an alloy of the formula:

$$\{\Sigma M_\gamma\}(Al_xGa_{1-x})$$

where:

$\Sigma M_\delta$ is a moiety which consists of at least one M, and when more than one M is present, each M is different, M is a metal selected from the group consisting of nickel, cobalt, ruthenium, rhodium, iridium and platinum, $\delta$ is a stoichiometric coefficient whose total value in any given $\Sigma M_\delta$ moiety is 1, and x is a positive number that ranges from greater than 0 to less than 1;

said alloy having the capacity when in combination with a substrate compound as defined above to exist as a two phase binary equilibrium reciprocal system having the formula:

$$\{\Sigma M_\delta\}Ga-\{\Sigma M_\delta\}Al-AlAs-GaAs$$

where:

$\Sigma M_\delta$, M and $\delta$ are as defined above, said sputtering being continued until a layer of said alloy is coated on said area; and (b) annealing said substrate at a temperature in the range of about 300° C. to about 850° C. for a selected time, the relationship between said alloy and said substrate and said sputtering and said annealing being such that after said annealing:

a metallic semiconductive interlayer is defined in a region located between said substrate and said alloy, said interlayer has a thickness in the range of about 80 to about 105 Å, and said interlayer contains aluminum, gallium and arsenic; thereby to produce said contact upon said substrate, wherein said so produced Schottky metal contact displays in combination with said substrate a Schottky barrier height $\phi_{Bn}$ that is in said range of about 0.6 to about 1 eV, said process comprising:

(1) carrying out each of said step (a) and said step (b) sequentially with each one of the alloy members of a series of alloys of one subclass of said alloy formula, said members differing from one another in composition, thereby to produce a metal contact on said substrate for each said alloy member;

(2) measuring said Schottky barrier height $\phi_{Bn}$ of each resulting combination comprised of said substrate and each said so produced metal contact, thereby to identify said Schottky barrier height that is so produced with each said alloy member;

(3) selecting a prechosen Schottky barrier height and comparing said prechosen Schottky barrier height $\phi_{Bn}$ to said so identified Schottky barrier heights, thereby to identify that one corresponding alloy member within said one subclass which produces said prechosen Schottky barrier height $\phi_{Bn}$; and (4) sequentially repeating under said controlled conditions each of said step (a) and said step (b) using said one corresponding alloy member, thereby to produce that Schottky metal contact that displays in combination with said substrate said prechosen Schottky barrier height $\phi_{Bn}$.

13. The process of claim 12 wherein said series of alloys of said subclass is characterized by having the subgeneric alloy formula:

$$Ni(Al_xGa_{1-x})$$

where x is as defined above, wherein said substrate comprises n-GaAs, and wherein the relationship between product Schottky barrier height $\phi_{Bn}$ and said series of alloys of said subclass is represented by the empirical equation:

$$\phi_{Bn}^{I-V} = 0.3247x/(0.1538+x)+0.68.$$

14. The process of claim 12 wherein said series of alloys of said subclass is characterized by having the subgeneric alloy formula:

$$Ni_yCo_{1-y}Al_xGa_{1-x}$$

where y is a positive number in the range from greater than 0 to less than 1 and x is as defined above, wherein said substrate comprises n-GaAs, and wherein the relationship between product barrier height $\phi_{Bn}$ and said series of alloys of said subclass is represented by the empirical equation:

$$\phi_{Bn}^{I-V} = 0.325x/(0.1538+x)+0.72.$$

15. A process for producing a Schottky metal contact for a Schottky diode upon one surface of a monocrystalline semiconductive substrate wherein the interrelationship between the resulting combination comprised of said Schottky metal contact and said substrate is such that said combination has a Schottky barrier height $\phi_{Bn}$ that is a value in the range of about 0.6 to about 1 eV, said method comprising the steps of:

(a) sequentially repeating each of the following steps (i) and (ii) for each of the member alloys of a series of alloys of one subclass of an alloy of the formula:

$$\{\Sigma M_\delta\}(Al_xGa_{1-x})$$

where:

$\Sigma M_\delta$ is a moiety which consists of at least one M, and when more than one M is present, each M is different, M is a metal selected from the group consisting of nickel, cobalt, ruthenium, rhodium, iridium and platinum, $\delta$ is a stoichiometric coefficient whose total value in any given $\Sigma M_\delta$ moiety is 1, and x is a positive number between 0 and 1 (that is, x ranges from greater than 0 to less than 1); said alloy having the capacity when in combination with a monocrystalline semiconductive substrate compound of the formula:

$$Al_vGa_{1-v}As$$

where v is a positive number ranging from and including 0 through 1 inclusive, to exist as a two phase binary equilibrium reciprocal system having the formula:

$$\{\Sigma M_\delta\}Ga-\{\Sigma M_\delta\}Al-AlAs-GaAs$$

where:

$\Sigma M_\delta$, M and $\delta$ are defined above, said steps (i) and (ii) comprising:

(i) sputtering a contact upon a localized surface area of one said monocrystalline semiconductive substrate compound, said contact being comprised on an alloy of said alloy formula, said sputtering being continued until said contact comprises a layer of said alloy that is coated on said area; and (ii) annealing said substrate and said coated contact at a temperature in the range of about 300° to about 850° C. for a selected time the relationship in the resulting combination of each said member alloy and said substrate after said sputtering and said annealing being such that:

a metallic semiconductive interlayer is defined in a region located between said substrate and said alloy, said interlayer has a thickness in the range of about 80 to about 105 Å, said interlayer contains aluminum, gallium and arsenic, and when interlayer contains aluminum, gallium and arsenic, and when a negative bias voltage in the range of about −10 to about 0 volts is applied between an exterior surface of said annealed contact and a portion of said substrate that is in adjacent but spaced relationship to said so annealed contact, no current flows, but when a positive bias voltage in the range of about 0.1 to about 0.7 volts is so applied, a current in the range of about $10^{-7}$ to about 0.5 milliamperes flows through said interlayer thereby to produce a metal contact on said substrate for each said member alloy;

(b) measuring said Schottky barrier height $\phi_{Bn}$ of each resulting said combination comprised of said substrate and each said annealed metal contact, thereby to identify said Schottky barrier height $\phi_{Bn}$ that is produced with each said member alloy;

(c) selecting a prechosen Schottky barrier height and comparing said prechosen Schottky barrier height $\phi_{Bn}$ value to said so identified Schottky barrier heights, thereby to identify that one corresponding alloy member within said one subclass which produces said prechosen Schottky barrier height $\phi_{Bn}$ value; and (d) sequentially repeating each of said steps (i) and (ii) using said one corresponding alloy member, thereby to produce that Schottky metal contact that displays in combination with said substrate said prechosen Schottky barrier height $\phi_{Bn}$ value.

16. The process of claim 15 wherein said series of alloys of said subclass is characterized by having the subgeneric alloy formula:

$$Ni(Al_xGa_{1-x})$$

where x is as defined above, wherein said substrate comprises n-GaAs, and wherein the relationship between product Schottky barrier height $\phi_{Bn}$ and said series of alloys of said subclass is represented by the empirical equation:

$$\phi_{Bn}{}^{I-V}=0.3247x/(0.1538+X)+0.68.$$

17. The process of claim 15 wherein said series of alloys of said subclass is characterized by having the subgeneric alloy formula:

$$Ni_yCo_{1-y}Al_xGa_{1-x}$$

where y is a positive number in the range from greater than 0 to less than 1 and x is as defined above, wherein said substrate comprises n-GaAs, and wherein the relationship between product barrier height $\phi_{Bn}$ and said series of alloys of said subclass is represented by the empirical equation:

$$\phi_{Bn}{}^{I-V}=0.325x/(0.1538+x)+0.72.$$

* * * * *